United States Patent
Chan et al.

(10) Patent No.: US 11,706,902 B2
(45) Date of Patent: Jul. 18, 2023

(54) COLD PLATE WITH POROUS THERMAL CONDUCTIVE STRUCTURE

(71) Applicant: AEM Singapore Pte. Ltd., Singapore (SG)

(72) Inventors: See Jean Chan, Singapore (SG); Zhaomeng Wang, Singapore (SG)

(73) Assignee: AEM SINGAPORE PTE. LTD., Singapore (SG)

( * ) Notice: Subject to any disclaimer, the term of this patent is extended or adjusted under 35 U.S.C. 154(b) by 51 days.

(21) Appl. No.: 17/406,277

(22) Filed: Aug. 19, 2021

(65) Prior Publication Data
US 2021/0385968 A1   Dec. 9, 2021

Related U.S. Application Data

(63) Continuation of application No. 16/774,274, filed on Jan. 28, 2020, now Pat. No. 11,129,297.

(30) Foreign Application Priority Data

May 27, 2019   (SG) .............................. 10201904782S

(51) Int. Cl.
*H05K 7/20*     (2006.01)
*F28F 7/02*     (2006.01)
(Continued)

(52) U.S. Cl.
CPC ............ *H05K 7/20254* (2013.01); *F28F 3/12* (2013.01); *F28F 7/02* (2013.01); *F28F 13/003* (2013.01);
(Continued)

(58) Field of Classification Search
CPC ............ H05K 7/20254; H05K 7/20772; H05K 7/20872; H05K 7/20927; H01L 23/473
See application file for complete search history.

(56) References Cited

U.S. PATENT DOCUMENTS 3,613,778 A   10/1971   Feldman, Jr.
3,755,543 A   8/1973    Latham, Jr.
(Continued)

FOREIGN PATENT DOCUMENTS

GB   2437382        10/2007
WO   2014085181     6/2014

OTHER PUBLICATIONS

Abbasali Abouei Mehrizi et al, Lattice Boltzmann Simulation of Heat Transfer Enhancement in a Cold Plate Using Porous Medium, Nov. 2013, Journal of Heat Transfer, vol. 135.

(Continued)

*Primary Examiner* — Zachary Pape
(74) *Attorney, Agent, or Firm* — Carlson, Gaskey & Olds, P.C.

(57) ABSTRACT

A cold plate may include a plate body having a thermal conductive side; a plurality of parallel hollow fluid channels running inside the plate body; at least one fluid inlet in direct fluid communication with a first subset of the plurality of parallel hollow fluid channels; at least one fluid outlet in direct fluid communication with a second subset of the plurality of parallel hollow fluid channels; and a porous thermal conductive structure which fluidly connect the first subset of the plurality of parallel hollow fluid channels to the second subset of the plurality of parallel hollow fluid channels, and which is in thermal contact with the thermal conductive side of the plate body. The porous thermal conductive structure may include a plurality of elongate fluid contact surface regions, each may be extending continuously lengthwise along a longitudinal side of respective fluid channel to serve as a fluid interface.

19 Claims, 7 Drawing Sheets

(51) Int. Cl.
  *F28F 13/00* (2006.01)
  *F28F 3/12* (2006.01)
  *B33Y 80/00* (2015.01)

(52) U.S. Cl.
  CPC ..... *H05K 7/20281* (2013.01); *H05K 7/20509* (2013.01); *B33Y 80/00* (2014.12)

(56) References Cited

U.S. PATENT DOCUMENTS

| | | | |
|---|---|---|---|
| 4,359,086 A | 11/1982 | Sanborn et al. | |
| 5,125,451 A | 6/1992 | Matthews | |
| 5,267,611 A | 12/1993 | Rosenfeld | |
| 6,018,459 A | 1/2000 | Carlson et al. | |
| 6,216,343 B1 | 4/2001 | Leland et al. | |
| 6,411,508 B1 | 6/2002 | Kang et al. | |
| 6,438,964 B1 | 8/2002 | Giblin | |
| 7,032,652 B2 | 4/2006 | Wang | |
| 7,044,199 B2 | 5/2006 | Thayer | |
| 7,124,809 B2 | 10/2006 | Rosenfeld et al. | |
| 7,806,168 B2 | 10/2010 | Upadhya | |
| 7,905,275 B2 | 3/2011 | Behrens | |
| 7,971,440 B2* | 7/2011 | Chan | H01L 23/38 62/3.6 |
| 8,162,035 B2 | 4/2012 | Behrens | |
| 8,505,616 B2* | 8/2013 | Behrens | F28D 1/0366 165/80.4 |
| 9,803,938 B2 | 10/2017 | Joshi | |
| 2002/0108743 A1 | 8/2002 | Wirtz | |
| 2003/0230401 A1 | 12/2003 | Pfister et al. | |
| 2004/0027806 A1 | 2/2004 | Lin | |
| 2005/0067155 A1 | 3/2005 | Thayer | |
| 2005/0082037 A1 | 4/2005 | Thayer et al. | |
| 2005/0269061 A1* | 12/2005 | Brewer | H01L 23/473 257/E23.098 |
| 2006/0096738 A1* | 5/2006 | Kang | F28F 3/022 257/E23.098 |
| 2006/0157225 A1 | 7/2006 | Martin et al. | |
| 2007/0034356 A1 | 2/2007 | Kenny | |
| 2007/0246191 A1 | 10/2007 | Behrens | |
| 2008/0105413 A1 | 5/2008 | Peng | |
| 2008/0179046 A1 | 7/2008 | Hisano et al. | |
| 2009/0145585 A1 | 6/2009 | Cosman | |
| 2010/0328888 A1 | 12/2010 | Campbell et al. | |
| 2011/0262695 A1 | 10/2011 | Lee et al. | |
| 2013/0032311 A1 | 2/2013 | Bhunia et al. | |
| 2016/0341495 A1 | 11/2016 | Hemker | |
| 2019/0077276 A1* | 3/2019 | Capati | H01M 10/613 |

OTHER PUBLICATIONS

W. H. Shih et al, Experimental Investigation of the Heat Transfer Characteristics of Aluminum-Foam Heat Sinks with Restricted Flow Outlet, Nov. 2007, Journal of Heat Transfer, vol. 129, pp. 1554-1563.

A. Bhattacharya, Metal Foam and Finned Metal Foam Heat Sinks for Electronics Cooling in Buoyancy-Induced Convection, Sep. 2006, Journal of Electronic Packaging, vol. 128, pp. 256-266.

Nawaz K et al, Thermal-hydraulic performance of metal foam heat exchangers under dry operating conditions, 2017, Applied Thermal Engineering 119:222-232.

Zmeškal, O.; Štefková, P. Study of Thermal Properties of Porous Materials. In Thermophysics 2004.

Chen Feng, Using Thermal Spray Technology to Make Heat Spreaders for LED Cooling, University of Toronto, 2014.

Songkran Wiriyasart et al, Study on the Heat Transfer Characteristics of a Vapor Chamber without Micro-channel for Cooling an Electronic Component, Jul.-Sep. 2013, Thammasat International Journal of Science and technology, vol. 18, No. 3, pp. 16-22.

Xianming Dai et al, Capillary Evaporation on Micromembrane-enhanced microchannel Wicks with Atomic Layer deposited Silica, Oct. 8, 2013, Applied Physics Letters 103.

Kulalov A. G. et al, Copper Sintered Powder Wick Structures of Miniature Heat Pipes, Sep. 2005, VI Minsk International Seminar "Heat Pipes, Heat Pumps, Refrigerators".

Sean H. Hoenig et al, Dropwise Condensation on Hydrophobic Microporous Powder and the Transition to Intrapowder Droplet Removal, Mar. 4-7, 2018, 3rd Thermal and Fluids Engineering Conference.

Ehsan Sadeghi, Estimation of Nusselt Number in Microchannels of Arbitrary Cross Section with Constant Axial Heat Flus, Feb. 1, 2010, Heat Transfer Engineering, vol. 31, No. 8, pp. 666-674.

Yakomaskin A. A. et al, Feasibility Study of Loop Heat Pipes with Flat Microchannel Evaporator and Non-Metal Wick, Nov. 6-9, 2011, 10th International Heat Pipe Symposium, pp. 143-146.

Sergii Khaimasov et al, Heat Pipes Application in Electronics Thermal Control Systems, 2015, Frontiers in Heat Pipes.

Mohammed t. Ababneh, Hybrid Heat Pipes for Planetary Surface and High Heat Flux Applications, Jul. 12-16, 2015, 45th International Conference on Environmental Systems.

Raed Abed Mahdi et al, Improvement of Convection Heat Transfer by Using Porous Media and Nanofluid: Review, Aug. 2013, International Journal of Science and Research, vol. 2 issue 8, pp. 34-47.

Sheng-Chung Tzeng et al, Mixed Convective Heat-transfers in a Porous Channel with Sintered Copper Beads, Dec. 24, 2004, Applied Energy 81, pp. 19-31.

B.D. Iverson et al, Heat and Mass Transport in Heat Pipe Wick Structures, 2007, Purdue University Pursue e-Pubs, CTRC Research Publications.

Waylon Tanner Puckett, Novel Substrates for Improved Cooling of Power Electronics, 2017, Georgia Institute of Technology.

Stephen Andrew Sharratt, Optimized Structures for Low-Profile Phase Change Thermal Spreaders, 2012, University of California Los Angeles.

Li Xi-bing et al, Sintering Technology for Micro Heat Pipe with Sintered Wick, Feb. 2010, Journal of central South University of technology, pp. 102-109.

Haydn N.G. Wadley et al, Thermal Applications of Cellular Lattice Structures, 2007, Materials Science Forum vols. 539-543, pp. 242-247.

Extended European Search Report for EP Application No. 20150686.2 dated Jul. 15, 2020.

Kazuhisa Yuki et al., Development of Functional Porous Heat Sink for Cooling High-Power Electronic Devices, 2012, Transactions of the Japan Institute of Electronics Packaging, vol. 5, No. 1, pp. 69-74.

* cited by examiner

COLD PLATE WITH POROUS THERMAL CONDUCTIVE STRUCTURE

CROSS-REFERENCE TO RELATED APPLICATIONS

The present application is a continuation of U.S. application Ser. No. 16/774,274 filed Jan. 28, 2020 which claims the benefit of the Singapore patent application No. 102019047825 filed on 27 May 2019, the entire contents of which are incorporated herein by reference for all purposes.

TECHNICAL FIELD

Various embodiments generally relate to a cold plate and a method of manufacturing the cold plate. In particular, various embodiments generally relate to a cold plate for active thermal control of electronics components.

BACKGROUND

Cold plates with liquid cooling have been commonly used for active thermal control of electronics component. To achieve liquid cooling, liquid flow path has been created inside the cold plate to move liquid through the cold plate.

In order to obtain a good cooling performance of the cold plate, microstructures are usually applied, through which the liquid coolant flow, such that the thermal energy that is transferred from the electronic component to the cold plate may be further transferred to the liquid coolant via the microstructure, whereby the thermal energy may be finally removed or taken away by the flowing liquid coolant. In general, a cold plate with smaller sized microstructure pattern may offer a better fluid-solid thermal transfer interface, and the thermal transfer resistance along the fluid-solid thermal transfer interface may be greatly reduced. Commonly used microstructure in conventional cold plates include repeated channel patterns, especially microchannels that are straight channels in diamond matrix patterns; zigzag patterned channels; or zigzag patterned channels with by-pass secondary channels.

However, fabrication of conventional cold plate can be very complex which may include micro drilling, wire cutting, etching, thermal bonding, or even physical vapor deposition (PVD) or chemical vapor deposition (CVD). Further, there is also a fabrication limit to the size of the microstructure whereby these fabrication methods cannot fabricate extremely small microstructure (e.g., cannot be as small as a few micro meters). In addition, the fabrication costs of conventional cold plate with microstructures via these fabrication methods are relatively high.

Accordingly, there is a need for a simpler and effective cold plate to address the above issues.

SUMMARY

According to various embodiments, there is provided a cold plate. The cold plate may include a plate body having a thermal conductive side. The cold plate may further include a plurality of parallel hollow fluid channels running inside the plate body. The cold plate may further include at least one fluid inlet in direct fluid communication with a first subset of the plurality of parallel hollow fluid channels. The cold plate may further include at least one fluid outlet in direct fluid communication with a second subset of the plurality of parallel hollow fluid channels. The cold plate may further include a porous thermal conductive structure which is arranged inside the plate body to fluidly connect the first subset of the plurality of parallel hollow fluid channels to the second subset of the plurality of parallel hollow fluid channels, and which is in thermal contact with the thermal conductive side of the plate body. According to various embodiments, the porous thermal conductive structure may include a plurality of elongate fluid contact surface regions. Each elongate fluid contact surface region may be extending continuously lengthwise along a longitudinal side of respective fluid channel for more than half a length of the longitudinal side to serve as a fluid interface between the porous thermal conductive structure and an interior volume of the respective hollow fluid channel.

According to various embodiments, there is provided a method of manufacturing a cold plate. The method may include integrally bonding a base part of a plate body, a porous thermal conductive structure, and a top part of a plate body in a manner to form the cold plate as described herein.

According to various embodiments, there is provided an active thermal control assembly. The active thermal control assembly may include the cold plate as described herein and a heater member coupled to the cold plate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1A:
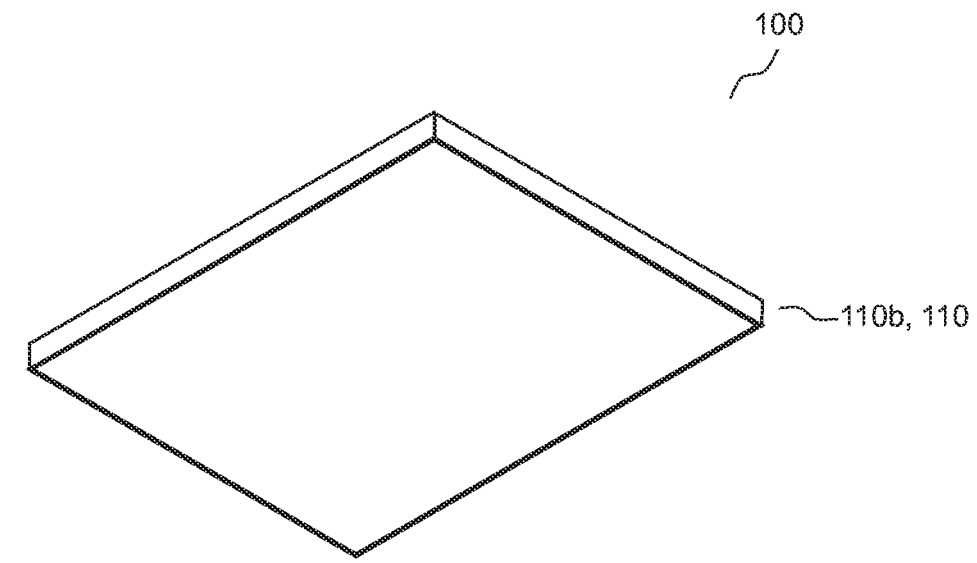
FIG. 1A shows a schematic diagram of a cold plate according to various embodiments wherein a plate body of the cold plate is being separated into two parts so as to show the inside of the cold plate.
Figure 1A:
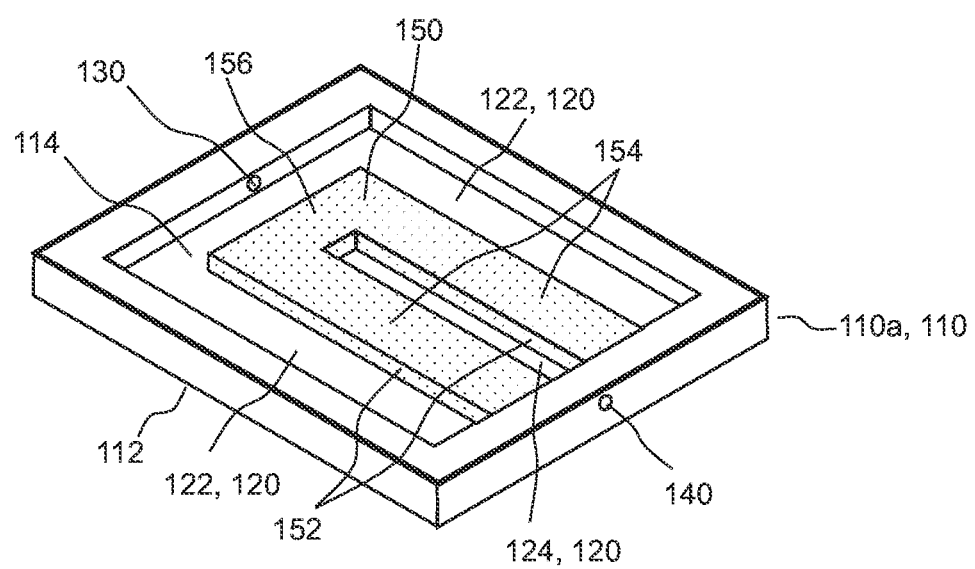

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various embodiments generally relate to a cold plate. In particular, various embodiments generally relate to a cold plate for active thermal control of electronics components. According to various embodiments, the cold plate may be used in active thermal control for temperature control of automation, electrical system, and/or chip testing/applications. According to various embodiments, the cold plate may be used on a Device under Test (DUT) in a testing environment.

Various embodiments generally relate to a cold plate having a porous thermal conductive structure inside the cold plate body. According to various embodiments, the porous thermal conductive structure may be made of porous thermal conductive materials. According to various embodiments, the porous thermal conductive materials may include, but not limited to, sintered metals, metal foam, metal mesh, three-dimensional (3D) printed porous metal structures/lattices, or even a simply 3D printed plate with controlled higher porosity (i.e. less material density), as well as other non-metal porous materials with acceptable thermal conductivity properties (i.e. at least along a single direction, e.g. vertical direction). According to various embodiments, the cold plate with the porous thermal conductive structure may be configured for single phase flowing fluid temperature control.

According to various embodiments, the porous thermal conductive structure of the cold plate may be configured to allow fluid to pass or permeate through the porous thermal conductive structure in a manner such that thermal energy exchange between the fluid and the porous thermal conductive material may occur within the porous thermal conductive structure. Accordingly, the fluid may flow through the porous thermal conductive structure so as to exchange thermal energy with the porous thermal conductive material. According to various embodiments, the application of the cold plate with the porous thermal conductive structure may not be limited to cooling, but may also be possibly used for heating when the internal flowing fluid is at a higher temperature. According to various embodiments, the cold plate with the porous thermal conductive structure may be used for both cooling and heating.

According to various embodiments, the porous thermal conductive structure of the cold plate may be configured to separate inlet fluid and outlet fluid. Accordingly, the porous thermal conductive structure may serve as a physical barrier between the inlet fluid and the outlet fluid such that the fluid has to pass or permeate through the porous thermal conductive structure in order to flow from the inlet to the outlet.

According to various embodiments, the porous thermal conductive structure of the cold plate may be configured to allow the fluid to pass or permeate through with a uniform pressure drop across respective portions of the porous thermal conductive structure. Accordingly, the fluid may pass or permeate through the respective portions of the porous thermal conductive structure at a uniform rate such that a uniform rate of thermal energy exchange may be achieved across the porous thermal conductive structure.

According to various embodiments, the cold plate and the porous thermal conductive structure of the cold plate may be configured to cooperatively spread and distribute the fluid uniformly across the cold plate in a manner so as to achieve uniform and/or symmetric cooling effect planarly across the cold plate. According to various embodiments, the cold plate and the porous thermal conductive structure of the cold plate may be configured to cooperatively direct the flow of fluid in a manner which removes the need to have a separate manifold to direct the flow. According to various embodiments, the cold plate may be free of a separate manifold or pipes for directing fluid flow.

According to various embodiments, the cold plate and the porous thermal conductive structure of the cold plate may be configured to create respective locations or spaces which serve as respective reservoirs or holding areas for the inlet fluid and outlet fluid. According to various embodiments, the respective reservoirs or holding areas may be configured so as to equalize the fluid pressure before the fluid pass or permeate through the porous thermal conductive structure.

According to various embodiments, the cold plate and the porous thermal conductive structure of the cold plate may be configured to cooperatively create short fluid flow path through the respective portions of the porous thermal conductive structure. Accordingly, the cold plate and the porous thermal conductive structure of the cold plate may be configured such that the fluid may experience only a small pressure drop across respective portions of the porous thermal conductive structure.

Figure 1B:
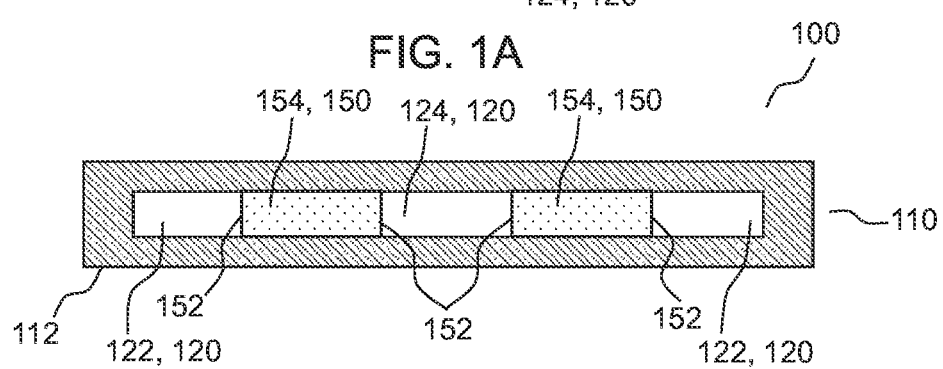
FIG. 1B shows a cross-sectional view of the schematic diagram of the cold plate of FIG. 1A according to various embodiments.

FIG. 1A shows a schematic diagram of a cold plate 100 according to various embodiments wherein a plate body 110 of the cold plate 100 is being separated into two parts 110a, 110b so as to show the inside of the cold plate 100. FIG. 1B shows a cross-sectional view of the schematic diagram of the cold plate 100 of FIG. 1A according to various embodiments. As shown, the cold plate 100 may include the plate body 110 which has a thermal conductive side 112. According to various embodiments, the plate body 110 may have a generally broad and thin body shape which may have two main opposite planar sides that may be broad and flat. According to various embodiments, one of the two main opposite planar sides of the plate body 110 may be thermal conductive, which forms the thermal conductive side 112 of the plate body 110. According to various embodiments, the thermal conductive side 112 of the plate body 110 of the cold plate 100 may be placed in contact with an electronic component which requires active thermal control such that there may be transfer of thermal energy between the cold plate 100 and the electronic component via the thermal conductive side 112 of the plate body 110.

According to various embodiments, the plate body 110 of the cold plate 100 may include a base part 110a (or a first part) and a top part 110b (or a second part). According to various embodiments, the base part 110a and the top part 110b may be integrally bonded together to form the plate body 110 of the cold plate 100 as a single unit or a one-piece structural whole. According to various embodiments, the base part 110a and the top part 110b may be integrally bonded via suitable bonding or joining techniques such as, but not limited to, brazing, diffusion bonding, welding, soldering, etc. According to various embodiments, the base part 110a and the top part 110b may be made of a same material. For example, both the base part 110a and the top part 110b may be made of a same thermal conductive material. According to various embodiments, the base part 110a and the top part 110b may be made of different materials. According to various embodiments, the base part 110a may be made of a first thermal conductive material and the top part 110b may be made of a second thermal conductive material (which is different from the first thermal conductive material). According to various embodiments, the base part 110a may be made of a thermal conductive material and the top part 110b may be made of material which does not have good thermal conductivity.

According to various embodiments, the cold plate 100 may include a plurality of parallel hollow fluid channels 120 running inside the plate body 110. According to various embodiments, the cold plate 100 may include two or three or four or five or more (or multiple) hollow fluid channels 120 extending and/or oriented in a same direction within the plate body 110. According to various embodiments, each hollow fluid channels 120 may be a channel free of solid or unfilled with solids or empty of solids such that fluid may freely flow through each hollow fluid channels 120. According to various embodiments, the plurality of parallel hollow fluid channels 120 may be spread or distributed planarly across and within the plate body 110 with respect to the thermal conductive side 112 of the plate body 110. According to various embodiments, the plurality of parallel hollow fluid channels 120 may be uniformly separated apart from each other, or may be arranged or laid out at regular interval from each other. According to various embodiments, the plurality of parallel hollow fluid channels 120 may be fully enclosed or encapsulated in the plate body 110.

According to various embodiments, the cold plate 100 may further include at least one fluid inlet 130. According to various embodiments, the at least one fluid inlet 130 may be an opening in the plate body 110 which may allow ingress of fluid into the plate body 110. According to various embodiments, the at least one fluid inlet 130 may be in direct fluid communication with a first subset 122 of the plurality of parallel hollow fluid channels 120. Accordingly, the at least one fluid inlet 130 may be connected to the first subset 122 of the plurality of parallel hollow fluid channels 120 in a manner such that fluid may flow freely from the at least one fluid inlet 130 to the first subset 122 of the plurality of parallel hollow fluid channels 120. Further, the at least one fluid inlet 130 may be connected to the first subset 122 of the plurality of parallel hollow fluid channels 120 in a manner such that the fluid entering via the at least one fluid inlet 130 may be directed to flow straight into the first subset 122 of the plurality of parallel hollow fluid channels 120. According to various embodiments, the at least one fluid inlet 130 and the first subset 122 of the plurality of parallel hollow fluid channels 120 may be connected along a hollow fluid path, which may be free of solid or unfilled with solids or empty of solids, such that the fluid may flow freely without obstructions or blockages. According to various embodiments, each of the first subset 122 of the plurality of parallel hollow fluid channels 120 may be a hollow fluid channel for inflow fluid. According to various embodiments, each of the first subset 122 of the plurality of parallel hollow fluid channels 120 may receive and temporary hold or accumulate the fluid entering the plate body 110 via the at least one fluid inlet 130.

According to various embodiments, the cold plate 100 may further include at least one fluid outlet 140. According to various embodiments, the at least one fluid outlet 140 may be an opening in the plate body 110 which may allow egress of fluid out of the plate body 110. According to various embodiments, the at least one fluid outlet 140 may be in direct fluid communication with a second subset 124 of the plurality of parallel hollow fluid channels 120. Accordingly, the at least one fluid outlet 140 may be connected to the second subset 124 of the plurality of parallel hollow fluid channels 120 in a manner such that fluid may flow freely from the second subset 124 of the plurality of parallel hollow fluid channels 120 to the at least one fluid outlet 140. Further, the second subset 124 of the plurality of parallel hollow fluid channels 120 may be connected to the at least one fluid outlet 140 in a manner such that the fluid may flow from the second subset 124 of the plurality of parallel hollow fluid channels 120 straight to the at least one fluid outlet 140 for exiting the plate body 110 of the cold plate 100. According to various embodiments, the second subset 124 of the plurality of parallel hollow fluid channels 120 and the at least one fluid outlet 140 may be connected along a hollow fluid path, which may be free of solid or unfilled with solids or empty of solids, such that the fluid may flow freely without obstructions or blockages. According to various embodiments, each of the second subset 124 of the plurality of parallel hollow fluid channels 120 may be a hollow fluid channel for outflow fluid. According to various embodiments, each of the second subset 124 of the plurality of parallel hollow fluid channels 120 may guide the fluid towards the at least one fluid outlet 140 to discharge the fluid out of the plate body 110 via the at least one fluid outlet 140.

According to various embodiments, the cold plate 100 may further include a porous thermal conductive structure 150. According to various embodiments, the porous thermal conductive structure 150 may be made of porous thermal conductive materials. According to various embodiments, the porous thermal conductive materials may include, but not limited to, sintered metals, metal foam, metal mesh, three-dimensional (3D) printed porous metal structures/lattices, or even a simply 3D printed plate with controlled higher porosity (i.e. less material density), as well as other non-metal porous materials with acceptable thermal conductivity properties (i.e. at least along a single direction, e.g. vertical direction).

According to various embodiments, the porous thermal conductive structure 150 may be in thermal contact with the thermal conductive side 112 of the plate body 110. According to various embodiments, thermal energy may be transferred from the thermal conductive side 112 of the plate body 110 to the porous thermal conductive structure 150 and vice versa.

According to various embodiments, the porous thermal conductive structure 150 may be arranged inside the plate body 110 to fluidly connect the first subset 122 of the plurality of parallel hollow fluid channels 120 to the second subset 124 of the plurality of parallel hollow fluid channels 120. According to various embodiments, the porous thermal conductive structure 150 may be configured to allow fluid to pass or permeate through the porous thermal conductive structure 150. According to various embodiments, the porous thermal conductive structure 150 may be configured to physically separate or demarcate or set apart the first subset 122 of the plurality of parallel hollow fluid channels 120 from the second subset 124 of the plurality of parallel hollow fluid channels 120 while allowing fluid passing or permeating therethrough to make the connection between the first subset 122 of the plurality of parallel hollow fluid channels 120 and the second subset 124 of the plurality of parallel hollow fluid channels 120. Accordingly, the first subset 122 of the plurality of parallel hollow fluid channels 120 and the second subset 124 of the plurality of parallel hollow fluid channels 120, which are so delineated by the porous thermal conductive structure 150, may be connected by the fluid passing or permeating through the porous thermal conductive structure 150. According to various embodiments, the porous thermal conductive structure 150 may serve as a physical barrier between the first subset 122 of the plurality of parallel hollow fluid channels 120 and the second subset 124 of the plurality of parallel hollow fluid channels 120 so as to delineate or demarcate a physical separation therebetween whereby the fluid has to pass or permeate through the porous thermal conductive structure 150 in order to flow from the first subset 122 of the plurality of parallel hollow fluid channels 120 to the second subset 124 of the plurality of parallel hollow fluid channels 120.

According to various embodiments, as the fluid pass or permeate through the porous thermal conductive structure 150, thermal energy exchange between the fluid and the porous thermal conductive material may occur within the porous thermal conductive structure 150. Accordingly, the fluid may flow through the porous thermal conductive structure 150 from the first subset 122 of the plurality of parallel hollow fluid channels 120 to the second subset 124 of the plurality of parallel hollow fluid channels 120 so as to exchange thermal energy with the porous thermal conductive material.

According to various embodiments, the porous thermal conductive structure 150 may include a plurality of elongate fluid contact surface regions 152. According to various embodiments, each elongate fluid contact surface regions 152 may be an area portion of an exterior surface of the porous thermal conductive structure 150 which may be in contact with the fluid that is inside the cold plate 100. According to various embodiments, each elongate fluid contact surface region 152 may be extending continuously lengthwise along a longitudinal side of respective fluid channel 120 for more than half a length of the longitudinal side to serve as a fluid interface between the porous thermal conductive structure 150 and an interior volume of the respective hollow fluid channel 120. According to various embodiments, each of the plurality of elongate fluid contact surface regions 152 of the porous thermal conductive structure 150 may be extending in a direction that is parallel to the plurality of parallel hollow fluid channels 120. According to various embodiments, each elongate fluid contact surface region 152 may be an uninterrupted elongate area portion of the exterior surface of the porous thermal conductive structure 150 that may span across more than half a length or a substantial length of the longitudinal side of the respective fluid channel 120. According to various embodiments, each elongate fluid contact surface region 152 may cover an entire length or almost an entire length of the longitudinal side of the respective fluid channel 120. According to various embodiments, with each elongate fluid contact surface region 152 extending continuously lengthwise along the longitudinal side of the respective fluid channel 120, the fluid in the respective fluid channel 120 may maximise contact with the porous thermal conductive structure 150 for entering or exiting the porous thermal conductive structure 150 transversely with respect to the longitudinal direction of the respective fluid channel 120.

According to various embodiments, the plurality of parallel hollow fluid channels 120 and the porous thermal conductive structure 150 may be configured to cooperate in a manner in which the fluid which flows into the first subset 122 of the plurality of parallel hollow fluid channels 120 via the at least one fluid inlet 130, may subsequently enter the porous thermal conductive structure 150 through a first subset of the plurality of elongate fluid contact surface regions 152 along respective longitudinal sides of the first subset 122 of the plurality of parallel hollow fluid channels 120 to permeate across respective portions of the porous thermal conductive structure 150 so as to cause a transfer of thermal energy between the fluid and the porous thermal conductive structure 150, and may subsequently exit the porous thermal conductive structure 150 through a second subset of the plurality of elongate fluid contact surface regions 152 along respective longitudinal sides of the second subset 124 of the plurality of parallel hollow fluid channels 120 to flow into the second subset 124 of the plurality of parallel hollow fluid channels 120 which may be further discharged via the at least one fluid outlet 140. According to various embodiments, the plurality of parallel hollow fluid channels 120 and the porous thermal conductive structure 150 may be shaped and arranged accordingly to achieve the desired flow path above.

According to various embodiments, the plurality of parallel hollow fluid channels 120 may be arranged in a manner so as to alternate between the first subset 122 of the plurality of parallel hollow fluid channels 120 and the second subset 124 of the plurality of parallel hollow fluid channels 120. According to various embodiments, the plurality of parallel hollow fluid channels 120 may be distributed or laid out across the plate body 110 in a sequence with a fluid channel from the first subset 122 of the plurality of parallel hollow fluid channels 120, followed by a fluid channel from the second subset 124 of the plurality of parallel hollow fluid channels 120, followed by another fluid channel from the first subset 122 of the plurality of parallel hollow fluid channels 120, and so on. According to various embodiments, with the arrangement of the alternating hollow fluid channels 120 between the first subset 122 of the plurality of parallel hollow fluid channels 120 and the second subset 124 of the plurality of parallel hollow fluid channels 120, the plurality of parallel hollow fluid channels 120 and the porous thermal conductive structure 150 may cooperatively create short fluid flow path through the respective portions of the porous thermal conductive structure 150. According to various embodiments, with the arrangement of the alternating hollow fluid channels 120 between the first subset 122 of the plurality of parallel hollow fluid channels 120 and the second subset 124 of the plurality of parallel hollow fluid channels 120, the plurality of parallel hollow fluid channels 120 and the porous thermal conductive structure 150 may be configured to cooperatively spread and distribute the fluid uniformly across the plate body 110 in a manner so as to achieve uniform and/or symmetric cooling effect planarly across the plate body 110.

As shown in FIG. 1A and FIG. 1B, according to various embodiments, the porous thermal conductive structure 150 may include one or more elongate portions 154. According to various embodiments, each of the one or more elongate portions 154 may physically separate or demarcate or delineate or set apart a first hollow fluid channel from a second hollow fluid channel. The first hollow fluid channel may be from the first subset 122 of the plurality of parallel hollow fluid channels 120 and the second hollow fluid channel may be from the second subset 124 of the plurality of parallel hollow fluid channels 120. According to various embodiments, each elongate portion 154 may have two elongated fluid contact surface regions 152 on two opposite longitudinal sides of the elongate portion 154. According to various embodiments, the first hollow fluid channel from the first subset 122 of the plurality of parallel hollow fluid channels 120 may be extending lengthwise along a first longitudinal side of the elongate portion 154 and the second hollow fluid channel from the second subset 124 of the plurality of parallel hollow fluid channels 120 may be extending lengthwise along a second opposite longitudinal side of the elongate portion 154. According to various embodiments, a first elongated fluid contact surface region 152 along a first longitudinal side of the elongate portion 154 may serve as a fluid interface with the first hollow fluid channel from the first subset 122 of the plurality of parallel hollow fluid channels 120, and a second elongate fluid contact surface region 152 along a second longitudinal side of the elongate portion 154 may serve as a fluid interface with the second hollow fluid channel from the second subset 124 of the plurality of parallel hollow fluid channels 120. According to various embodiments, the fluid from the first hollow fluid channel (from the first subset 122 of the plurality of parallel hollow fluid channels 120) may flow to the second hollow fluid channel (from the second subset 124 of the plurality of parallel hollow fluid channels 120) by passing or permeating transversely through or across the elongate portion 154.

According to various embodiments, the porous thermal conductive structure 150 may include at least two parallel elongate portions 154 joined by at least a bend portion 156 so as to form a single continuous structure. According to various embodiments, the single continuous structure of the porous thermal conductive structure 150 may physically separate or demarcate or delineate or set apart the first subset 122 of the plurality of parallel hollow fluid channels 120 from the second subset 124 of the plurality of parallel hollow fluid channels 120. According to various embodiments, the single continuous structure of the porous thermal conductive structure 150 with the at least two parallel elongate portions 154 may be configured to physically separate or demarcate or delineate or set apart the plurality of parallel hollow fluid channels 120 into the arrangement which alternates between the first subset 122 of the plurality of parallel hollow fluid channels 120 and the second subset 124 of the plurality of parallel hollow fluid channels 120.

According to various embodiments, the at least two parallel elongate portions 154 may be spaced apart from each other at regular interval so as to uniformly separate the plurality of parallel hollow fluid channels 120 from each other. According to various embodiments, a width of each of the at least two parallel elongate portions 154 may be uniform along its length. According to various embodiments, the at least two parallel elongate portions 154 may have the same width.

According to various embodiments, the plate body 110 may include an inner cavity 114. According to various embodiments, the porous thermal conductive structure 150 may be disposed in the inner cavity 114 of the plate body 110 in a manner so as to divide the inner cavity 114 into the plurality of parallel hollow fluid channels 120. According to various embodiments, the base part 110a of the plate body 110 may include the inner cavity 114 being recessed into the base part 110a. According to various embodiments, the porous thermal conductive structure 150 may be integrally bonded to the base part 110a via suitable bonding or joining techniques such as, but not limited to, brazing, diffusion bonding, welding, soldering, etc. According to various embodiments, the inner cavity 114 of the plate body 110 may have at least one alignment element along a side wall of the inner cavity 114 and the porous thermal conductive structure 150 may have a corresponding alignment element. Accordingly, the alignment elements may be configured to fit the porous thermal conductive structure 150 in a predetermined orientation before the porous thermal conductive structure 150 may be integrally bonded to the base part 110a. According to various embodiments, the base part 110a and the porous thermal conductive structure 150 may be made of the same or different thermal conductive material.

According to various embodiments, the porous thermal conductive structure 150 may be integrally molded or printed with the base part 110a. Accordingly, the base part 110a may be integrally formed with the porous thermal conductive structure 150 and the plurality of parallel hollow fluid channels 120 as a single complete structure without requiring bonding or joining of two or more pieces. According to various embodiments, the base part 110a and the porous thermal conductive structure 150 may be made of the same thermal conductive material.

According to various embodiments, the inner cavity 114 of the base plate 110a may have a uniform height and the porous thermal conductive structure 150 may have a uniform thickness. According to various embodiments, the height of the inner cavity 114 may be equal to the thickness of the porous thermal conductive structure 150. According to various embodiments, the top part 110b may be integrally bonding to the base part 110a and the porous thermal conductive structure 150 via suitable bonding or joining techniques such as, but not limited to, brazing, diffusion bonding, welding, soldering, etc. According to various embodiments, when the base part 110a, the porous thermal conductive structure 150, and the top part 110b are integrally bonded together, the first subset 122 of the plurality of parallel hollow fluid channels 120 may be separated from the second subset 124 of the plurality of parallel hollow fluid channels 120 while being fluidly connected via the porous thermal conductive structure 150.

Figure 2A:
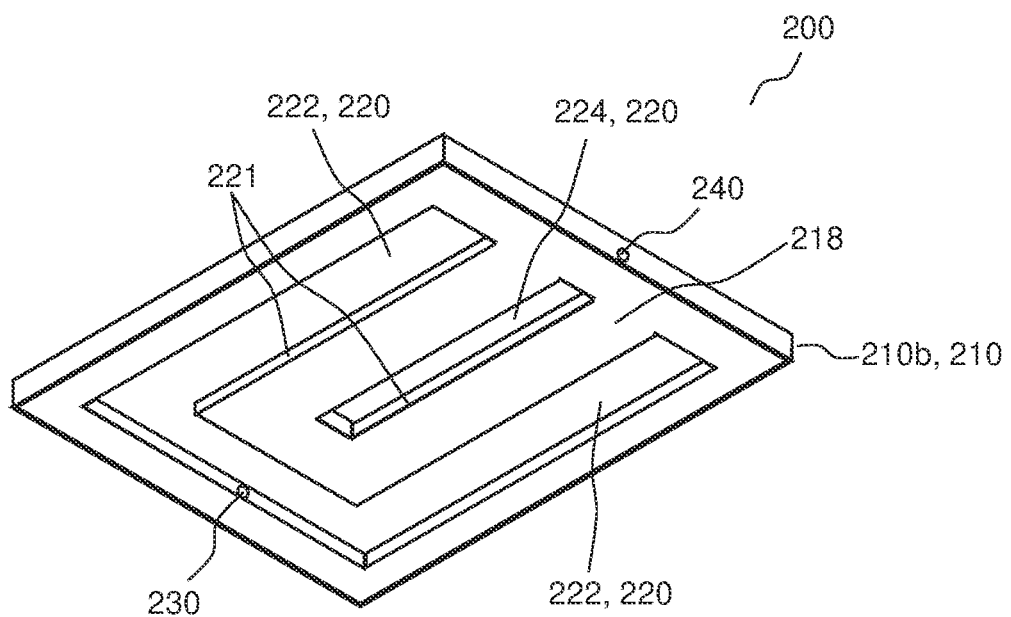
FIG. 2A shows a schematic diagram of a cold plate according to various embodiments wherein a plate body of the cold plate is being separated into two parts so as to show the inside of the cold plate.
Figure 2B:
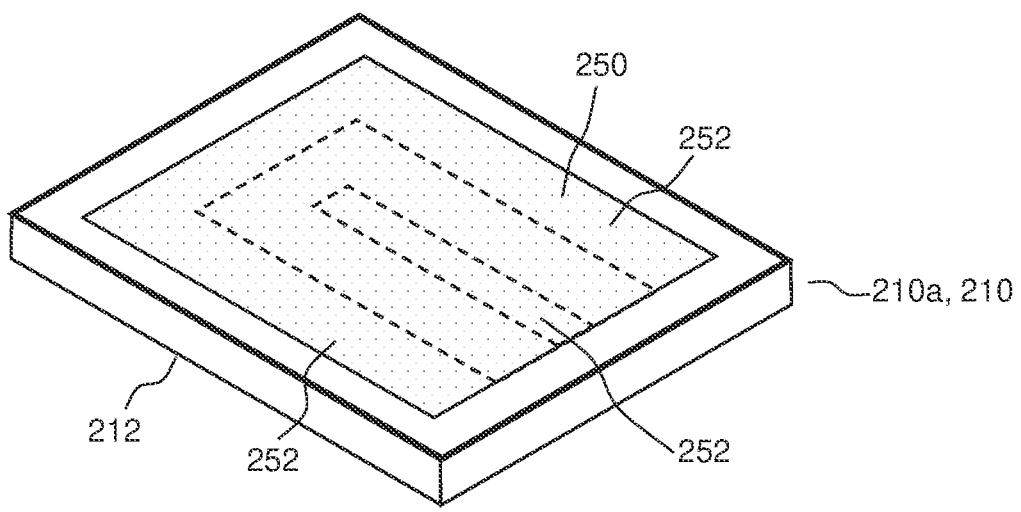
FIG. 2B shows a cross-sectional view of the schematic diagram of the cold plate of FIG. 2A according to various embodiments.
Figure 2B:
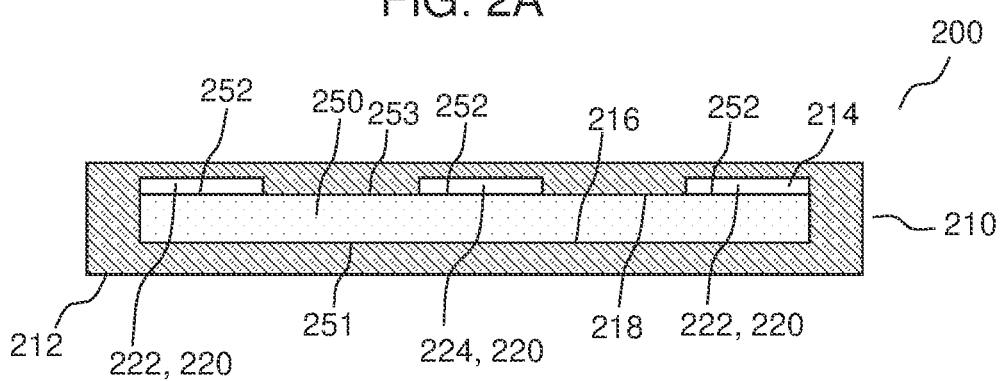

FIG. 2A shows a schematic diagram of a cold plate 200 according to various embodiments wherein a plate body 210 of the cold plate 200 is being separated into two parts 210a, 210b so as to show the inside of the cold plate 200. FIG. 2B shows a cross-sectional view of the schematic diagram of the cold plate 200 of FIG. 2A according to various embodiments. As shown, the cold plate 200 may include the plate body 210 which has a thermal conductive side 212. According to various embodiments, the plate body 210 may have a generally broad and thin body shape which may have two main opposite planar sides that may be broad and flat. According to various embodiments, one of the two main opposite planar sides of the plate body 210 may be thermal conductive, which forms the thermal conductive side 212 of the plate body 110. According to various embodiments, the thermal conductive side 212 of the plate body 110 of the cold plate 100 may be placed in contact with an electronic component which requires active thermal control such that there may be transfer of thermal energy between the cold plate 200 and the electronic component via the thermal conductive side 212 of the plate body 210.

According to various embodiments, the plate body 210 of the cold plate 200 may include a base part 210a (or a first part) and a top part 210b (or a second part). According to various embodiments, the base part 210a and the top part 210b may be integrally bonded together to form the plate body 210 of the cold plate 200 as a single unit or a one-piece structural whole. According to various embodiments, the base part 210a and the top part 210b may be integrally bonded via suitable bonding or joining techniques such as, but not limited to, brazing, diffusion bonding, welding, soldering, etc. According to various embodiments, the base part 210a and the top part 210b may be made of a same material. For example, both the base part 210a and the top part 210b may be made of a same thermal conductive material. According to various embodiments, the base part 210a and the top part 210b may be made of different materials. According to various embodiments, the base part 210a may be made of a first thermal conductive material and the top part 210b may be made of a second thermal conductive material (which is different from the first thermal conductive material). According to various embodiments, the base part 210a may be made of a thermal conductive material and the top part 110b may be made of material which does not have good thermal conductivity.

According to various embodiments, the cold plate 200 may include a plurality of parallel hollow fluid channels 220 running inside the plate body 210. According to various embodiments, the cold plate 200 may include two or three or four or five or more (or multiple) hollow fluid channels 220 extending and/or oriented in a same direction within the plate body 210. According to various embodiments, each hollow fluid channels 220 may be a channel free of solid or unfilled with solids or empty of solids such that fluid may freely flow through each hollow fluid channels 220. According to various embodiments, the plurality of parallel hollow fluid channels 220 may be spread or distributed planarly across and within the plate body 210 with respect to the thermal conductive side 212 of the plate body 210. According to various embodiments, the plurality of parallel hollow fluid channels 220 may be uniformly separated apart from each other, or may be arranged or laid out at regular interval from each other. According to various embodiments, the plurality of parallel hollow fluid channels 220 may be fully enclosed or encapsulated in the plate body 210.

According to various embodiments, the cold plate 200 may further include at least one fluid inlet 230. According to various embodiments, the at least one fluid inlet 230 may be an opening in the plate body 210 which may allow ingress of fluid into the plate body 110. According to various embodiments, the at least one fluid inlet 230 may be in direct fluid communication with a first subset 222 of the plurality of parallel hollow fluid channels 220. Accordingly, the at least one fluid inlet 230 may be connected to the first subset 222 of the plurality of parallel hollow fluid channels 220 in a manner such that fluid may flow freely from the at least one fluid inlet 230 to the first subset 222 of the plurality of parallel hollow fluid channels 220. Further, the at least one fluid inlet 230 may be connected to the first subset 222 of the plurality of parallel hollow fluid channels 220 in a manner such that the fluid entering via the at least one fluid inlet 230 may be directed to flow straight into the first subset 222 of the plurality of parallel hollow fluid channels 220. According to various embodiments, the at least one fluid inlet 230 and the first subset 222 of the plurality of parallel hollow fluid channels 220 may be connected along a hollow fluid path, which may be free of solid or unfilled with solids or empty of solids, such that the fluid may flow freely without obstructions or blockages. According to various embodiments, each of the first subset 222 of the plurality of parallel hollow fluid channels 220 may be a hollow fluid channel for inflow fluid. According to various embodiments, each of the first subset 222 of the plurality of parallel hollow fluid channels 220 may receive and temporary hold or accumulate the fluid entering the plate body 210 via the at least one fluid inlet 230.

According to various embodiments, the cold plate 200 may further include at least one fluid outlet 240. According to various embodiments, the at least one fluid outlet 240 may be an opening in the plate body 210 which may allow egress of fluid out of the plate body 210. According to various embodiments, the at least one fluid outlet 240 may be in direct fluid communication with a second subset 224 of the plurality of parallel hollow fluid channels 220. Accordingly, the at least one fluid outlet 240 may be connected to the second subset 224 of the plurality of parallel hollow fluid channels 220 in a manner such that fluid may flow freely from the second subset 224 of the plurality of parallel hollow fluid channels 220 to the at least one fluid outlet 240. Further, the second subset 224 of the plurality of parallel hollow fluid channels 220 may be connected to the at least one fluid outlet 240 in a manner such that the fluid may flow from the second subset 224 of the plurality of parallel hollow fluid channels 220 straight to the at least one fluid outlet 240 for exiting the plate body 210 of the cold plate 200. According to various embodiments, the second subset 224 of the plurality of parallel hollow fluid channels 220 and the at least one fluid outlet 240 may be connected along a hollow fluid path, which may be free of solid or unfilled with solids or empty of solids, such that the fluid may flow freely without obstructions or blockages. According to various embodiments, each of the second subset 224 of the plurality of parallel hollow fluid channels 220 may be a hollow fluid channel for outflow fluid. According to various embodiments, each of the second subset 224 of the plurality of parallel hollow fluid channels 220 may guide the fluid towards the at least one fluid outlet 240 to discharge the fluid out of the plate body 210 via the at least one fluid outlet 240.

According to various embodiments, the cold plate 200 may further include a porous thermal conductive structure 250. According to various embodiments, the porous thermal conductive structure 250 may be made of porous thermal conductive materials. According to various embodiments, the porous thermal conductive materials may include, but not limited to, sintered metals, metal foam, metal mesh, three-dimensional (3D) printed porous metal structures/lattices, or even a simply 3D printed plate with controlled higher porosity (i.e. less material density), as well as other non-metal porous materials with acceptable thermal conductivity properties (i.e. at least along a single direction, e.g. vertical direction).

According to various embodiments, the porous thermal conductive structure 250 may be in thermal contact with the thermal conductive side 212 of the plate body 210. According to various embodiments, thermal energy may be transferred from the thermal conductive side 212 of the plate body 210 to the porous thermal conductive structure 250 and vice versa.

According to various embodiments, the porous thermal conductive structure 250 may be arranged inside the plate body 210 to fluidly connect the first subset 222 of the plurality of parallel hollow fluid channels 220 to the second subset 224 of the plurality of parallel hollow fluid channels 220. According to various embodiments, the porous thermal conductive structure 250 may be configured to allow fluid to pass or permeate through the porous thermal conductive structure 250. According to various embodiments, the porous thermal conductive structure 250 may be configured to physically separate or set apart the first subset 222 of the plurality of parallel hollow fluid channels 220 from the second subset 224 of the plurality of parallel hollow fluid channels 220 while allowing fluid passing or permeating therethrough to make the connection between the first subset 222 of the plurality of parallel hollow fluid channels 220 and the second subset 224 of the plurality of parallel hollow fluid channels 220. Accordingly, the first subset 222 of the plurality of parallel hollow fluid channels 220 and the second subset 224 of the plurality of parallel hollow fluid channels 220, which are so separated by the porous thermal conductive structure 250, may be connected by the fluid passing or permeating through the porous thermal conductive structure 250. According to various embodiments, the porous thermal conductive structure 250 may serve as a physical barrier between the first subset 222 of the plurality of parallel hollow fluid channels 220 and the second subset 224 of the plurality of parallel hollow fluid channels 220 so as to be a physical separation therebetween whereby the fluid has to pass or permeate through the porous thermal conductive structure 250 in order to flow from the first subset 222 of the plurality of parallel hollow fluid channels 220 to the second subset 224 of the plurality of parallel hollow fluid channels 220.

According to various embodiments, as the fluid pass or permeate through the porous thermal conductive structure 250, thermal energy exchange between the fluid and the porous thermal conductive material may occur within the porous thermal conductive structure 250. Accordingly, the fluid may flow through the porous thermal conductive structure 250 from the first subset 222 of the plurality of parallel hollow fluid channels 220 to the second subset 224 of the plurality of parallel hollow fluid channels 220 so as to exchange thermal energy with the porous thermal conductive material.

According to various embodiments, the porous thermal conductive structure 250 may include a plurality of elongate fluid contact surface regions 252. According to various embodiments, each elongate fluid contact surface regions 252 may be an area portion of an exterior surface of the porous thermal conductive structure 250 which may be in contact with the fluid that is inside the cold plate 200. According to various embodiments, each elongate fluid contact surface region 252 may be extending continuously lengthwise along a longitudinal side of respective fluid channel 220 for more than half a length of the longitudinal side to serve as a fluid interface between the porous thermal conductive structure 250 and an interior volume of the respective hollow fluid channel 220. According to various embodiments, each of the plurality of elongate fluid contact surface regions 252 of the porous thermal conductive structure 250 may be extending in a direction that is parallel to the plurality of parallel hollow fluid channels 220. According to various embodiments, each elongate fluid contact surface region 252 may be an uninterrupted elongate area portion of the exterior surface of the porous thermal conductive structure 250 that may span across more than half a length or a substantial length of the longitudinal side of the respective fluid channel 220. According to various embodiments, each elongate fluid contact surface region 252 may cover an entire length or almost an entire length of the longitudinal side of the respective fluid channel 220. According to various embodiments, with each elongate fluid contact surface region 252 extending continuously lengthwise along the longitudinal side of the respective fluid channel 220, the fluid in the respective fluid channel 220 may maximise contact with the porous thermal conductive structure 250 for entering or exiting the porous thermal conductive structure 250 transversely with respect to the longitudinal direction of the respective fluid channel 220.

According to various embodiments, the plurality of parallel hollow fluid channels 220 and the porous thermal conductive structure 250 may be configured to cooperate in a manner in which the fluid which flows into the first subset 222 of the plurality of parallel hollow fluid channels 220 via the at least one fluid inlet 230, may subsequently enter the porous thermal conductive structure 250 through a first subset of the plurality of elongate fluid contact surface regions 252 along respective longitudinal sides of the first subset 222 of the plurality of parallel hollow fluid channels 220 to permeate across respective portions of the porous thermal conductive structure 250 so as to cause a transfer of thermal energy between the fluid and the porous thermal conductive structure 250, and may subsequently exit the porous thermal conductive structure 250 through a second subset of the plurality of elongate fluid contact surface regions 252 along respective longitudinal sides of the second subset 224 of the plurality of parallel hollow fluid channels 220 to flow into the second subset 224 of the plurality of parallel hollow fluid channels 220 which may be further discharged via the at least one fluid outlet 240. According to various embodiments, the plurality of parallel hollow fluid channels 220 and the porous thermal conductive structure 250 may be shaped and arranged accordingly to achieve the desired flow path above.

According to various embodiments, the plurality of parallel hollow fluid channels 220 may be arranged in a manner so as to alternate between the first subset 222 of the plurality of parallel hollow fluid channels 220 and the second subset 224 of the plurality of parallel hollow fluid channels 220. According to various embodiments, the plurality of parallel hollow fluid channels 220 may be distributed or laid out across the plate body 210 in a sequence with a fluid channel from the first subset 222 of the plurality of parallel hollow fluid channels 220, followed by a fluid channel from the second subset 224 of the plurality of parallel hollow fluid channels 220, followed by another fluid channel from the first subset 222 of the plurality of parallel hollow fluid channels 220, and so on. According to various embodiments, with the arrangement of the alternating hollow fluid channels 220 between the first subset 222 of the plurality of parallel hollow fluid channels 220 and the second subset 224 of the plurality of parallel hollow fluid channels 220, the plurality of parallel hollow fluid channels 220 and the porous thermal conductive structure 250 may cooperatively create short fluid flow path through the respective portions of the porous thermal conductive structure 250. According to various embodiments, with the arrangement of the alternating hollow fluid channels 220 between the first subset 222 of the plurality of parallel hollow fluid channels 220 and the second subset 224 of the plurality of parallel hollow fluid channels 220, the plurality of parallel hollow fluid channels 220 and the porous thermal conductive structure 250 may be configured to cooperatively spread and distribute the fluid uniformly across the plate body 210 in a manner so as to achieve uniform and/or symmetric cooling effect planarly across the plate body 210.

As shown in FIG. 2A and FIG. 2B, according to various embodiments, the plate body 210 may include an inner cavity 214 having a floor surface 216 at the thermal conductive side 212 of the plate body 210 and an opposing ceiling surface 218 with the plurality of parallel hollow fluid channels 220 recessed into the ceiling surface 218. According to various embodiments, the plate body 210 may include the base part 210a having a recessed portion which forms the floor surface 216 at the base part 210a of the plate body 210. According to various embodiments, the plate body may include the top part 210b having the ceiling surface 218 and with the plurality of parallel hollow fluid channels 220 recessed into the ceiling surface 218 of the top part 210b. According to various embodiments, the porous thermal conductive structure 250 may include a block structure with a base surface 251 in engagement with the floor surface 216 of the inner cavity 214 and an opposite top surface 253 in engagement with the ceiling surface 218 of the inner cavity 214. According to various embodiments, the porous thermal conductive structure 250 may fill up the recessed portion of the base part 210a. According to various embodiments, when the top part 210b is integrally bonded to the base part 210a, the ceiling surface 218 of the top part 210b may be in contact with the top surface 253 of the porous thermal conductive structure 250.

According to various embodiments, since the plurality of parallel hollow fluid channels 220 are recessed into the ceiling surface 218 of the top part 210b and the ceiling surface 218 of the top part 210b are in contact with the top surface 253 of the porous thermal conductive structure 250, the plurality of elongate fluid contact surface regions 254 of the porous thermal conductive structure 250 may be on the top surface 253 of the porous thermal conductive structure 250. According to various embodiments, the plurality of elongate fluid contact surface regions 254 of the porous thermal conductive structure 250 may be a plurality of elongate area portions on the top surface 253 of the porous thermal conductive structure 250. Each of the elongate fluid contact surface regions 254 on the top surface 253 of the porous thermal conductive structure 150 may correspond to a location of the respective hollow fluid channels 220 in the ceiling surface 218 of the top part 210b.

According to various embodiments, since the plurality of parallel hollow fluid channels 220 are recessed into the ceiling surface 218 of the top part 210b, channel walls 221 may be formed in the top part 210b which may laterally separates the first subset 222 of the plurality of parallel hollow fluid channels 220 from the second subset 224 of the plurality of parallel hollow fluid channels 220. According to various embodiments, respective openings of the plurality of parallel hollow fluid channels 220 along the ceiling surface 218 of the top part 210b may be covered or closed by the top surface 253 of the porous thermal conductive structure 250 such that the porous thermal conductive structure 250 physically separate or set apart the respective openings of the first subset 222 of the plurality of parallel hollow fluid channels 220 from the respective openings of the second subset 224 of the plurality of parallel hollow fluid channels 220 in a manner which requires the fluid to pass or permeate therethrough so as to flow from the first subset 222 of the plurality of parallel hollow fluid channels 220 and the second subset 224 of the plurality of parallel hollow fluid channels 220.

According to various embodiments, the porous thermal conductive structure 250 in the recessed portion of the based part 210a may be integrally bonded to the base part 210a via suitable bonding or joining techniques such as, but not limited to, brazing, diffusion bonding, welding, soldering, etc. According to various embodiments, the base part 210a and the porous thermal conductive structure 250 may be made of the same or different thermal conductive material.

According to various embodiments, the porous thermal conductive structure 250 may be integrally molded or printed with the base part 210a. Accordingly, the base part 210a may be integrally formed with the porous thermal conductive structure 250 as a single complete structure without requiring bonding or joining of two or more pieces. According to various embodiments, the base part 210a and the porous thermal conductive structure 250 may be made of the same thermal conductive material.

According to various embodiments, the recessed portion of the base plate 210a may have a uniform height and the porous thermal conductive structure 250 may have a uniform thickness. According to various embodiments, the height of the recessed portion of the base plate 210a may be equal to the thickness of the porous thermal conductive structure 250. According to various embodiments, the top part 210b may be integrally bonding to the base part 210a and the porous thermal conductive structure 250 via suitable bonding or joining techniques such as, but not limited to, brazing, diffusion bonding, welding, soldering, etc. According to various embodiments, when the base part 210a, the porous thermal conductive structure 250, and the top part 210b are integrally bonded together, the first subset 222 of the plurality of parallel hollow fluid channels 220 may be separated from the second subset 224 of the plurality of parallel hollow fluid channels 220 while being fluidly connected via the porous thermal conductive structure 250.

Figure 3A:
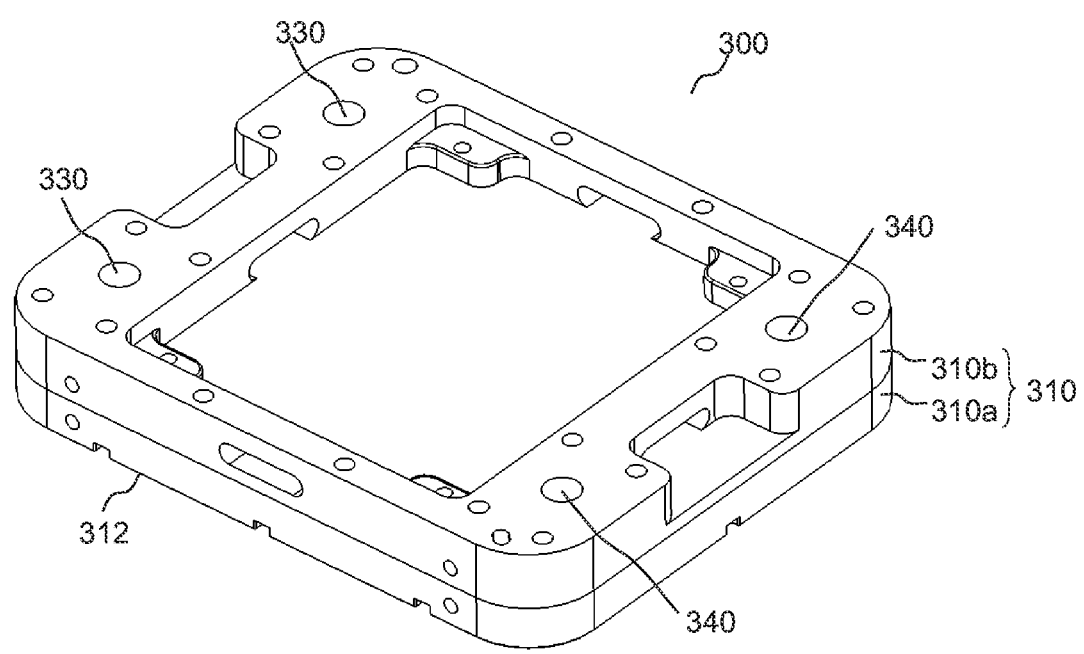
FIG. 3A shows a perspective view of a cold plate according to various embodiments.
Figure 3B:
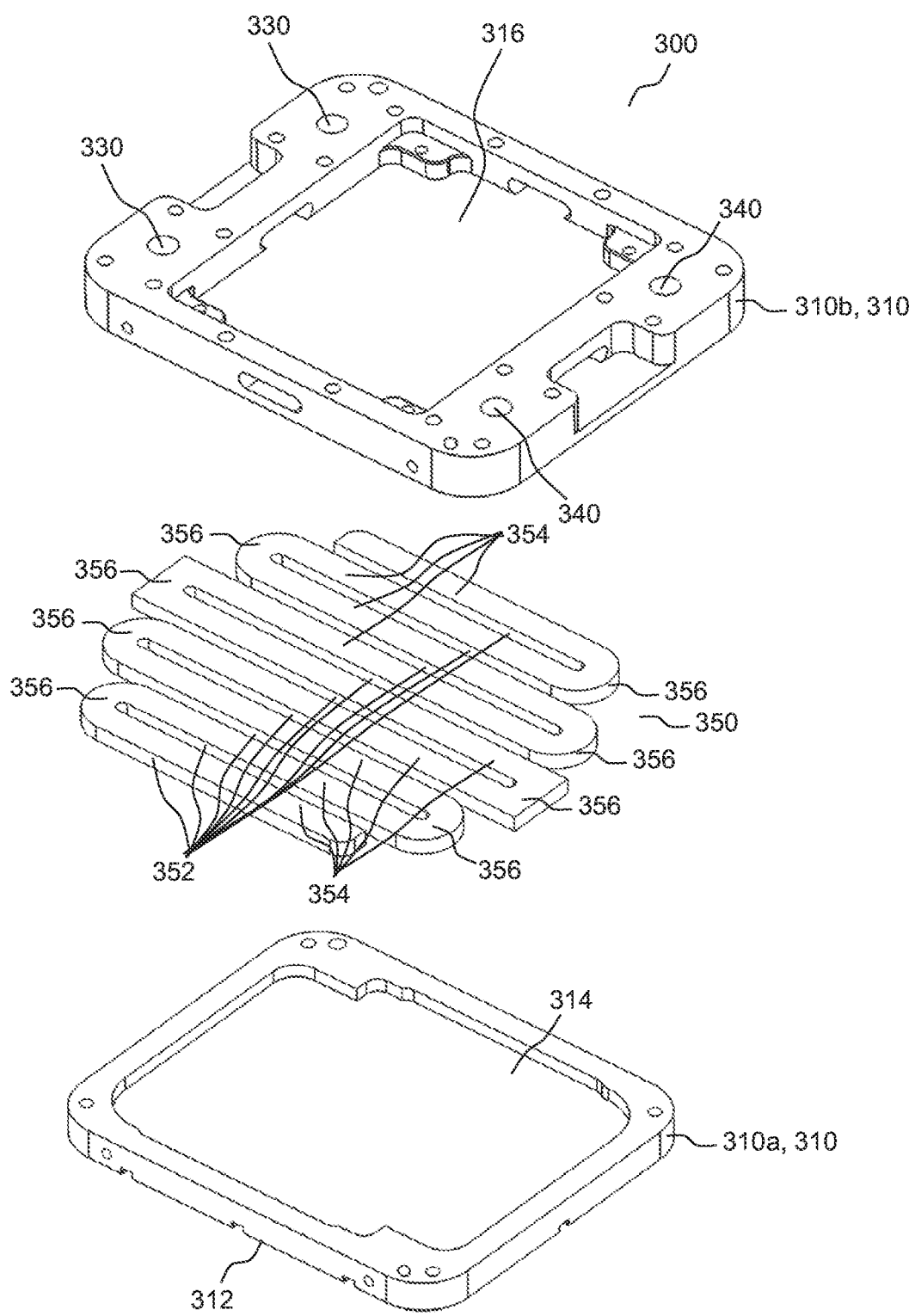
FIG. 3B shows an exploded view of the cold plate of FIG. 3A according to various embodiments.
Figure 3C:
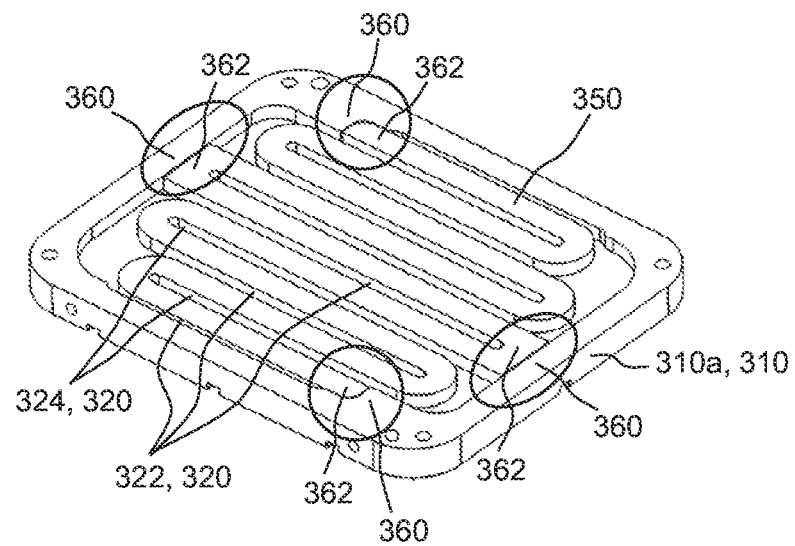
FIG. 3C shows a perspective view of a base part with a porous thermal conductive structure of the cold plate of FIG. 3A and FIG. 3B according to various embodiments.
Figure 3D:
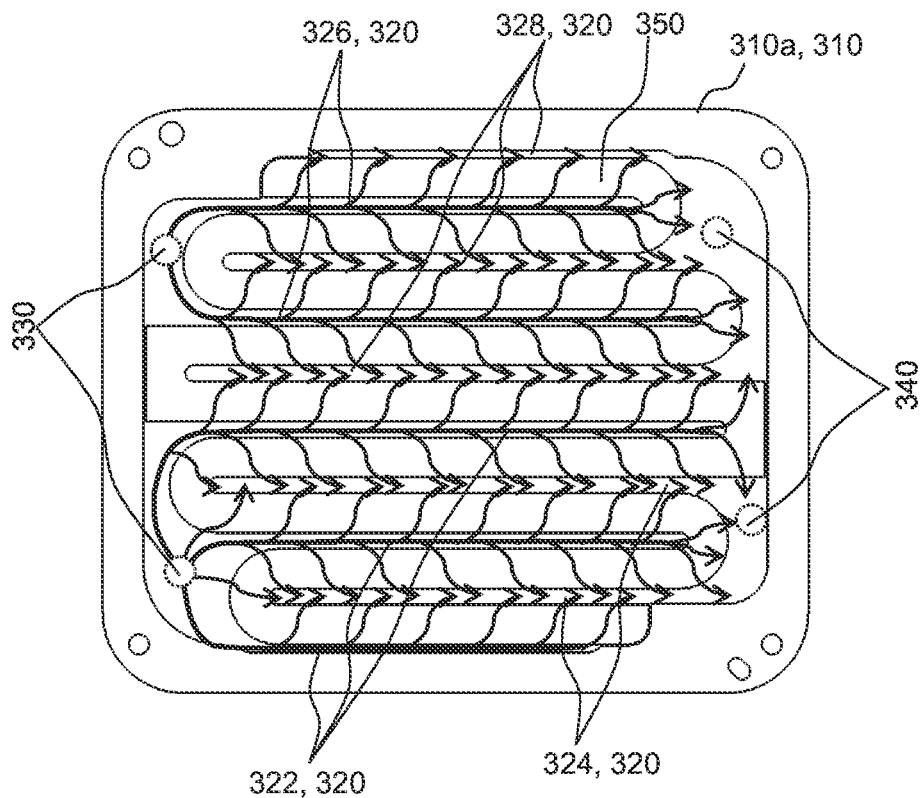
FIG. 3D shows a top view of the base part with the porous thermal conductive structure of FIG. 3C according to various embodiments.
Figure 3E:
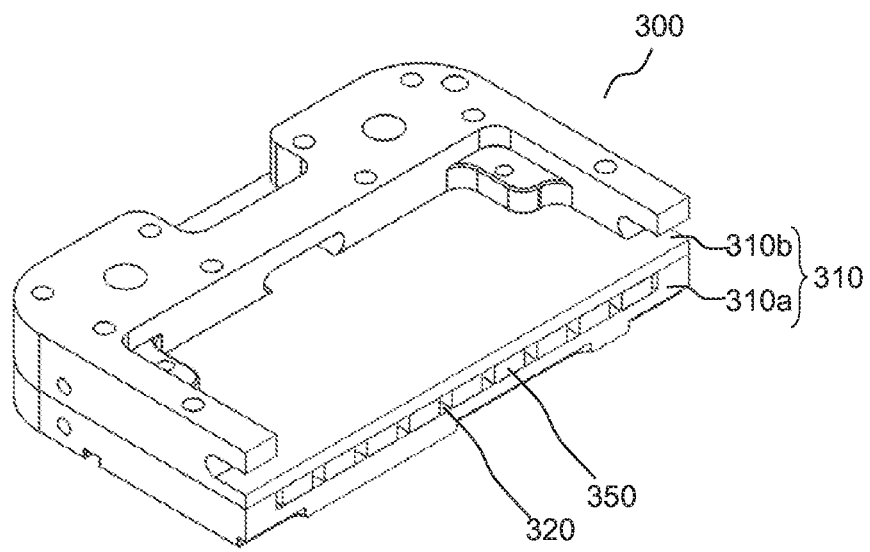
FIG. 3E shows a cross section of the cold plate of FIG. 3A according to various embodiments.

FIG. 3A shows a perspective view of a cold plate 300 according to various embodiments. FIG. 3B shows an exploded view of the cold plate 300 of FIG. 3A according to various embodiments. FIG. 3C shows a perspective view of a base part 310a with a porous thermal conductive structure 350 of the cold plate 300 of FIG. 3A and FIG. 3B according to various embodiments. FIG. 3D shows a top view of the base part 310a with the porous thermal conductive structure 350 of FIG. 3C according to various embodiments. FIG. 3E shows a cross section of the cold plate 300 of FIG. 3A according to various embodiments. According to various embodiments, the cold plate 300 of FIG. 3A to FIG. 3E may contain all the features of the cold plate 100 of FIG. 1A and FIG. 1B. Accordingly, all features, changes, modifications, and variations that are applicable to the cold plate 100 of FIG. 1A and FIG. 1B may also be applicable to the cold plate 300 of FIG. 3A to FIG. 3E.

According to various embodiments, the cold plate 300 may, similar to the cold plate 100 of FIG. 1A and FIG. 1B, include a plate body 310 which has a thermal conductive side 312. According to various embodiments, the plate body 310 may have a generally broad and thin body shape which may have two main opposite planar sides that may be broad and flat. According to various embodiments, one of the two main opposite planar sides of the plate body 310 may be thermal conductive, which forms the thermal conductive side 312 of the plate body 310. According to various embodiments, the thermal conductive side 312 of the plate body 310 of the cold plate 300 may be placed in contact with an electronic component which requires active thermal control such that there may be transfer of thermal energy between the cold plate 300 and the electronic component via the thermal conductive side 312 of the plate body 310.

According to various embodiments, the plate body 310 of the cold plate 300 may include a base part 310a (or a first part or a bottom plate) and a top part 310b (or a second part or a top plate). According to various embodiments, the base part 310a and the top part 310b may be integrally bonded together to form the plate body 310 of the cold plate 300 as a single unit or a one-piece structural whole. According to various embodiments, the base part 310a and the top part 310b may be integrally bonded via suitable bonding or joining techniques such as, but not limited to, brazing, diffusion bonding, welding, soldering, etc. According to various embodiments, the base part 310a and the top part 310b may be made of a same material. For example, both the base part 310a and the top part 310b may be made of a same thermal conductive material. According to various embodiments, the base part 310a and the top part 310b may be integrally bonded to enclose an inner cavity 314. According to various embodiments, the base part 310a and the top part 310b may be made of different materials. According to various embodiments, the base part 310a may be made of a first thermal conductive material and the top part 310b may be made of a second thermal conductive material (which is different from the first thermal conductive material). According to various embodiments, the base part 310a may be made of a thermal conductive material and the top part 310b may be made of material which does not have good thermal conductivity.

According to various embodiments, the cold plate 300 may, similar to the cold plate 100 of FIG. 1A and FIG. 1B, further include a porous thermal conductive structure 350. According to various embodiments, the porous thermal conductive structure 350 may be made of porous thermal conductive materials. According to various embodiments, the porous thermal conductive materials may include, but not limited to, sintered metals, metal foam, metal mesh, three-dimensional (3D) printed porous metal structures/lattices, or even a simply 3D printed plate with controlled higher porosity (i.e. less material density), as well as other non-metal porous materials with acceptable thermal conductivity properties (i.e. at least along a single direction, e.g. vertical direction). According to various embodiments, the porous thermal conductive structure 350 may be a two dimensional (2D) regular structure (e.g., micro rectangular channels, or packed micro pipes), or a three dimensional (3D) structure (e.g. packed copper balls structure). The term "2D regular structure" refers to a straight extrusion of a two dimensional pattern that makes the fluid flow in a two dimensional flow (e.g. in X, Y directions). For example, the "2D regular structure" may direct the fluid to flow two-dimensionally across a plane of a heat exchange zone. The term "3D structure" refers to a structure that causes the fluid to flow in a three dimensional flow (e.g. in X, Y & Z directions). According to various embodiments, the cold plate 300 may include a fluid which may flow through the porous thermal conductive material, exchanging thermal energy with the porous thermal conductive structure 350. Accordingly, the application of the cold plate 300 having the porous thermal conductive structure 350 may not be limited to cooling, but also possible for heating when the internal flowing fluid is at a higher temperature. Hence, the cold plate 300 may be used vice versa. According to various embodiments, the porous thermal conductive structure 350 may be in thermal contact with the thermal conductive side 312 of the plate body 310. According to various embodiments, thermal energy may be transferred from the thermal conductive side 312 of the plate body 310 to the porous thermal conductive structure 350 and vice versa.

According to various embodiments, besides the single phase fluids, phase change coolants may also be applicable for the cold plate 300.

According to an example embodiment, the cold plate 300 may be configured for cooling, and the cold plate 300 may include cold fluid flowing therethrough in order for thermal energy exchange to occur at the porous thermal conductive structure 350 such that the cooling process can take place. According to various embodiments, the cold fluid may include cold coolant. According to various embodiments, the cold coolant may include, but not limited to, cold hydrofluoroether (HFE), or water, or even cold air. According to various embodiments, the cold coolant may be used to cool down the cold plate 300. Accordingly, the cold plate 300 may in turn cool down the electronic component which is in contact with the cold plate 300.

According to various embodiments, the cold plate 300 may include three distinctive parts, namely, the base part 310a, the top part 310b and the porous thermal conductive structure 350. According to various embodiments, the cold plate 300 may be formed by bonding the base part 310a, the top part 310b and the porous thermal conductive structure 350 together. According to various embodiments, the base part 310a, the top part 310b and the porous thermal conductive structure 350 may be compressed and bonded (e.g. brazing using silver sheet, or thermal diffusion bonding, or other bonding methods), leaving no gap along the vertical direction between the interface of the base part 310a and the top part 310b. According to various embodiments, the base part 310a and the top part 310b may enclose the inner cavity 314, and the porous thermal conductive structure 350 may be fitted inside the inner cavity 314 of the plate body 310 (formed by the based part 310a and the top part 310b). According to various embodiments, the porous thermal conductive structure 350 may be sandwiched by the the base part 310a and the top part 310b of the plate body 310.

According to various embodiments, the cold plate 300 may, similar to the cold plate 100 of FIG. 1A and FIG. 1B, include a plurality of parallel hollow fluid channels 320 running inside the plate body 310. According to various embodiments, the cold plate 300 may include two or three or four or five or more (or multiple) hollow fluid channels 320 extending and/or oriented in a same direction within the plate body 310. According to various embodiments, each hollow fluid channels 320 may be a channel free of solid or unfilled with solids or empty of solids such that fluid may freely flow through each hollow fluid channels 320. According to various embodiments, the plurality of parallel hollow fluid channels 320 may be spread or distributed planarly across and within the plate body 310 with respect to the thermal conductive side 312 of the plate body 310. According to various embodiments, the plurality of parallel hollow fluid channels 320 may be uniformly separated apart from each other, or may be arranged or laid out at regular interval from each other. According to various embodiments, the plurality of parallel hollow fluid channels 320 may be fully enclosed or encapsulated in the plate body 310.

According to various embodiments, the cold plate 300 may, similar to the cold plate 100 of FIG. 1A and FIG. 1B, further include at least one fluid inlet 330. According to various embodiments, the at least one fluid inlet 330 may be an opening in the plate body 310 which may allow ingress of fluid into the plate body 310. According to various embodiments, the at least one fluid inlet 330 may be in direct fluid communication with a first subset 322 of the plurality of parallel hollow fluid channels 320. Accordingly, the at least one fluid inlet 330 may be connected to the first subset 322 of the plurality of parallel hollow fluid channels 320 in a manner such that fluid may flow freely from the at least one fluid inlet 330 to the first subset 322 of the plurality of parallel hollow fluid channels 320. Further, the at least one fluid inlet 330 may be connected to the first subset 322 of the plurality of parallel hollow fluid channels 320 in a manner such that the fluid entering via the at least one fluid inlet 330 may be directed to flow straight into the first subset 322 of the plurality of parallel hollow fluid channels 320. According to various embodiments, the at least one fluid inlet 330 and the first subset 322 of the plurality of parallel hollow fluid channels 320 may be connected along a hollow fluid path, which may be free of solid or unfilled with solids or empty of solids, such that the fluid may flow freely without obstructions or blockages. According to various embodiments, each of the first subset 322 of the plurality of parallel hollow fluid channels 320 may be a hollow fluid channel for inflow fluid. According to various embodiments, each of the first subset 322 of the plurality of parallel hollow fluid channels 320 may receive and temporary hold or accumulate the fluid entering the plate body 310 via the at least one fluid inlet 330.

According to various embodiments, the cold plate 300 may, similar to the cold plate 100 of FIG. 1A and FIG. 1B, further include at least one fluid outlet 340. According to various embodiments, the at least one fluid outlet 340 may be an opening in the plate body 310 which may allow egress of fluid out of the plate body 310. According to various embodiments, the at least one fluid outlet 340 may be in direct fluid communication with a second subset 324 of the plurality of parallel hollow fluid channels 320. Accordingly, the at least one fluid outlet 340 may be connected to the second subset 324 of the plurality of parallel hollow fluid channels 320 in a manner such that fluid may flow freely from the second subset 324 of the plurality of parallel hollow fluid channels 320 to the at least one fluid outlet 340. Further, the second subset 324 of the plurality of parallel hollow fluid channels 320 may be connected to the at least one fluid outlet 340 in a manner such that the fluid may flow from the second subset 324 of the plurality of parallel hollow fluid channels 320 straight to the at least one fluid outlet 340 for exiting the plate body 310 of the cold plate 300. According to various embodiments, the second subset 324 of the plurality of parallel hollow fluid channels 320 and the at least one fluid outlet 340 may be connected along a hollow fluid path, which may be free of solid or unfilled with solids or empty of solids, such that the fluid may flow freely without obstructions or blockages. According to various embodiments, each of the second subset 324 of the plurality of parallel hollow fluid channels 320 may be a hollow fluid channel for outflow fluid. According to various embodiments, each of the second subset 324 of the plurality of parallel hollow fluid channels 320 may guide the fluid towards the at least one fluid outlet 340 to discharge the fluid out of the plate body 310 via the at least one fluid outlet 340.

According to various embodiments, the porous thermal conductive structure 350 of the cold plate 300 may be arranged inside the plate body 310 to fluidly connect the first subset 322 of the plurality of parallel hollow fluid channels 320 to the second subset 324 of the plurality of parallel hollow fluid channels 320. According to various embodiments, the porous thermal conductive structure 350 may be configured to allow fluid to pass or permeate through the porous thermal conductive structure 350. According to various embodiments, the porous thermal conductive structure 350 may be configured to physically separate or demarcate or set apart the first subset 322 of the plurality of parallel hollow fluid channels 320 from the second subset 324 of the plurality of parallel hollow fluid channels 320 while allowing fluid passing or permeating therethrough to make the connection between the first subset 322 of the plurality of parallel hollow fluid channels 320 and the second subset 324 of the plurality of parallel hollow fluid channels 320. Accordingly, the first subset 322 of the plurality of parallel hollow fluid channels 320 and the second subset 324 of the plurality of parallel hollow fluid channels 320, which are so delineated by the porous thermal conductive structure 350, may be connected by the fluid passing or permeating through the porous thermal conductive structure 350. According to various embodiments, the porous thermal conductive structure 350 may serve as a physical barrier between the first subset 322 of the plurality of parallel hollow fluid channels 320 and the second subset 324 of the plurality of parallel hollow fluid channels 320 so as to delineate or demarcate a physical separation therebetween whereby the fluid has to pass or permeate through the porous thermal conductive structure 350 in order to flow from the first subset 322 of the plurality of parallel hollow fluid channels 320 to the second subset 324 of the plurality of parallel hollow fluid channels 320.

According to various embodiments, as the fluid pass or permeate through the porous thermal conductive structure 350, thermal energy exchange between the fluid and the porous thermal conductive material may occur within the porous thermal conductive structure 350. Accordingly, the fluid may flow through the porous thermal conductive structure 350 from the first subset 322 of the plurality of parallel hollow fluid channels 320 to the second subset 324 of the plurality of parallel hollow fluid channels 320 so as to exchange thermal energy with the porous thermal conductive material.

According to various embodiments, the plurality of parallel hollow fluid channels 320 may be formed, for example by cutting or machining or molding or printing or bending etc., within the porous thermal conductive structure 350. According to various embodiments, the porous thermal conductive structure 350 may have a structure or a shape defining the plurality of parallel hollow fluid channels 320. According to various embodiments, the porous thermal conductive structure 350 may have a structure or a shape which may segregate the plurality of parallel hollow fluid channels 320 into the first subset 322 of the plurality of parallel hollow fluid channels 320 and the second subset 324 of the plurality of parallel hollow fluid channels 320.

According to various embodiments, the porous thermal conductive structure 350 may include a plurality of elongate fluid contact surface regions 352. According to various embodiments, each elongate fluid contact surface regions 352 may be an area portion of an exterior surface of the porous thermal conductive structure 350 which may be in contact with the fluid that is inside the cold plate 300. According to various embodiments, each elongate fluid contact surface region 352 may be extending continuously lengthwise along a longitudinal side of respective fluid channel 320 for more than half a length of the longitudinal side to serve as a fluid interface between the porous thermal conductive structure 350 and an interior volume of the respective hollow fluid channel 320. According to various embodiments, each of the plurality of elongate fluid contact surface regions 352 of the porous thermal conductive structure 350 may be extending in a direction that is parallel to the plurality of parallel hollow fluid channels 320. According to various embodiments, each elongate fluid contact surface region 352 may be an uninterrupted elongate area portion of the exterior surface of the porous thermal conductive structure 350 that may span across more than half a length or a substantial length of the longitudinal side of the respective fluid channel 320. According to various embodiments, each elongate fluid contact surface region 352 may cover an entire length or almost an entire length of the longitudinal side of the respective fluid channel 320. According to various embodiments, with each elongate fluid contact surface region 352 extending continuously lengthwise along the longitudinal side of the respective fluid channel 320, the fluid in the respective fluid channel 320 may maximise contact with the porous thermal conductive structure 350 for entering or exiting the porous thermal conductive structure 350 transversely with respect to the longitudinal direction of the respective fluid channel 320.

According to various embodiments, the plurality of parallel hollow fluid channels 320 and the porous thermal conductive structure 350 may be configured to cooperate in a manner in which the fluid which flows into the first subset 322 of the plurality of parallel hollow fluid channels 320 via the at least one fluid inlet 330, may subsequently enter the porous thermal conductive structure 350 through a first subset of the plurality of elongate fluid contact surface regions 352 along respective longitudinal sides of the first subset 322 of the plurality of parallel hollow fluid channels 320 to permeate across respective portions of the porous thermal conductive structure 350 so as to cause a transfer of thermal energy between the fluid and the porous thermal conductive structure 350, and may subsequently exit the porous thermal conductive structure 350 through a second subset of the plurality of elongate fluid contact surface regions 352 along respective longitudinal sides of the second subset 324 of the plurality of parallel hollow fluid channels 320 to flow into the second subset 324 of the plurality of parallel hollow fluid channels 320 which may be further discharged via the at least one fluid outlet 340. According to various embodiments, the plurality of parallel hollow fluid channels 320 and the porous thermal conductive structure 350 may be shaped and arranged accordingly to achieve the desired flow path above.

According to various embodiments, the fluid may enter the cold plate 300 from the at least one fluid inlet 330, spread inside the cold plate 300 through the plurality of parallel hollow fluid channels 320 within the porous thermal conductive structure 350, then pass or permeate or cross through the porous thermal conductive structure 350 (which serve as a porous medium), and finally flow out of the cold plate 300 through the at least one fluid outlet 340. According to various embodiments, the assignment of the at least one fluid inlet 330 and the at least one fluid outlet 340 may be arbitrary. Accordingly, the assignment of the at least one fluid inlet 330 and the at least one fluid outlet 340 may be switched and the flow direction may be reversed. As shown in FIG. 3A, according to various embodiments, respective axis of respective opening of respective fluid inlet 330 and fluid outlet 340 may be perpendicular to the thermal conductive side 312 of the plate body 310. According to various embodiments, the respective axis of the respective opening of the respective fluid inlet 330 and fluid outlet 340 may be along any other directions, for example being parallel or at an angle with respect to the thermal conductive side 312 of the plate body 310. According to various embodiments, the orientation and location of the respective fluid inlet 330 and fluid outlet 340 may be based on the piping arrangement of the fluid from the fluid source or reservoir.

According to various embodiments, the plurality of parallel hollow fluid channels 320 may be arranged in a manner so as to alternate between the first subset 322 of the plurality of parallel hollow fluid channels 320 and the second subset 324 of the plurality of parallel hollow fluid channels 320. According to various embodiments, the plurality of parallel hollow fluid channels 320 may be distributed or laid out across the plate body 310 in a sequence with a fluid channel from the first subset 322 of the plurality of parallel hollow fluid channels 320, followed by a fluid channel from the second subset 324 of the plurality of parallel hollow fluid channels 320, followed by another fluid channel from the first subset 322 of the plurality of parallel hollow fluid channels 320, and so on. According to various embodiments, with the arrangement of the alternating hollow fluid channels 320 between the first subset 322 of the plurality of parallel hollow fluid channels 320 and the second subset 324 of the plurality of parallel hollow fluid channels 320, the plurality of parallel hollow fluid channels 320 and the porous thermal conductive structure 350 may cooperatively create short fluid flow path through the respective portions of the porous thermal conductive structure 350. According to various embodiments, with the arrangement of the alternating hollow fluid channels 320 between the first subset 322 of the plurality of parallel hollow fluid channels 320 and the second subset 324 of the plurality of parallel hollow fluid channels 320, the plurality of parallel hollow fluid channels 320 and the porous thermal conductive structure 350 may be configured to cooperatively spread and distribute the fluid uniformly across the plate body 310 in a manner so as to achieve uniform and/or symmetric cooling effect planarly across the plate body 310.

As shown in FIG. 3B to FIG. 3D, according to various embodiments, the porous thermal conductive structure 350 may include one or more elongate portions 354. According to various embodiments, each of the one or more elongate portions 354 may physically separate or demarcate or delineate or set apart a first hollow fluid channel from a second hollow fluid channel. The first hollow fluid channel may be from the first subset 322 of the plurality of parallel hollow fluid channels 320 and the second hollow fluid channel may be from the second subset 324 of the plurality of parallel hollow fluid channels 320. According to various embodiments, each elongate portion 354 may have two elongated fluid contact surface regions 352 on two opposite longitudinal sides of the elongate portion 354. According to various embodiments, the first hollow fluid channel from the first subset 322 of the plurality of parallel hollow fluid channels 320 may be extending lengthwise along a first longitudinal side of the elongate portion 354 and the second hollow fluid channel from the second subset 324 of the plurality of parallel hollow fluid channels 320 may be extending lengthwise along a second opposite longitudinal side of the elongate portion 354. According to various embodiments, a first elongated fluid contact surface region 352 along a first longitudinal side of the elongate portion 354 may serve as a fluid interface with the first hollow fluid channel from the first subset 322 of the plurality of parallel hollow fluid channels 320, and a second elongate fluid contact surface region 352 along a second longitudinal side of the elongate portion 354 may serve as a fluid interface with the second hollow fluid channel from the second subset 324 of the plurality of parallel hollow fluid channels 320. According to various embodiments, the fluid from the first hollow fluid channel (from the first subset 322 of the plurality of parallel hollow fluid channels 320) may flow to the second hollow fluid channel (from the second subset 324 of the plurality of parallel hollow fluid channels 320) by passing or permeating transversely through or across the elongate portion 354.

According to various embodiments, the porous thermal conductive structure 350 may include a serpentine-shaped thermal conductive structure having at least two parallel elongate portions 354 joined by at least a bend portion 356 so as to form a single continuous structure. According to various embodiments, the serpentine-shaped thermal conductive structure of the porous thermal conductive structure 350 may include a plurality of parallel elongate portions 354 wherein each elongate portion 354 may be joined to an immediately adjacent elongate portion 354 via respective bend portion 356 at an end of the elongate portion 354. According to various embodiments, the serpentine-shaped thermal conductive structure of the porous thermal conductive structure 350 may include a plurality of bend portions 356, which alternate between two ends of respective elongate portion 354, joining the plurality of parallel elongate portions 354 of the porous thermal conductive structure 350.

According to various embodiments, the single continuous structure of the porous thermal conductive structure 350 may physically separate or demarcate or delineate or set apart the first subset 322 of the plurality of parallel hollow fluid channels 320 from the second subset 324 of the plurality of parallel hollow fluid channels 320. According to various embodiments, the single continuous structure of the porous thermal conductive structure 350 with the at least two parallel elongate portions 354 may be configured to physically separate or demarcate or delineate or set apart the plurality of parallel hollow fluid channels 320 into the arrangement which alternates between the first subset 322 of the plurality of parallel hollow fluid channels 320 and the second subset 324 of the plurality of parallel hollow fluid channels 320.

According to various embodiments, the at least two parallel elongate portions 354 may be spaced apart from each other at regular interval so as to uniformly separate the plurality of parallel hollow fluid channels 320 from each other. According to various embodiments, a width of each of the at least two parallel elongate portions 354 may be uniform along its length. According to various embodiments, the at least two parallel elongate portions 354 may have the same width.

According to various embodiments, the plate body 310 may include the inner cavity 314. According to various embodiments, the porous thermal conductive structure 350 may be disposed in the inner cavity 314 of the plate body 310 in a manner so as to divide the inner cavity 314 into the plurality of parallel hollow fluid channels 320. According to various embodiments, the base part 310a of the plate body 310 may include the inner cavity 314 being recessed into the base part 310a. According to various embodiments, the porous thermal conductive structure 350 may be fitted into the inner cavity 314 of the base part 310a. According to various embodiments, the inner cavity 314 of the plate body 310 may have at least one alignment element 360 along a side wall of the inner cavity 314 and the porous thermal conductive structure 350 may have a corresponding alignment element 362. Accordingly, the alignment elements pair 360, 362 may be configured to fit the porous thermal conductive structure 350 in a predetermined orientation into the inner cavity 314 of the base part 310a of the plate body 310. According to various embodiments, the alignment element 360 of the inner cavity 314 may be a small indentation (e.g. a 0.1 mm indentation) and the corresponding alignment element 362 of the porous thermal conductive structure 350 may be a corresponding small raised portion (e.g. a 0.1 mm raised portion). According to various embodiments, the alignment element 360 of the inner cavity 314 may be a concave shaped portion and the corresponding alignment element 362 of the porous thermal conductive structure 350 may be a corresponding convex shaped portion. As shown in FIG. 3C, the alignment elements pair 360, 362 are within the circled zones. According to various embodiments, the alignment elements pair 360, 362 may facilitate alignment when fitting or mounting the porous thermal conductive structure 350 inside the inner cavity 314 of the base part 310a of the plate body 310.

According to various embodiments, the porous thermal conductive structure 350 may be integrally bonded to the base part 310a via suitable bonding or joining techniques such as, but not limited to, brazing, diffusion bonding, welding, soldering, etc. According to various embodiments, the base part 310a and the porous thermal conductive structure 350 may be made of the same or different thermal conductive material. According to various embodiments, the porous thermal conductive structure 350 may be integrally molded or printed with the base part 310a. Accordingly, the base part 310a may be integrally formed with the porous thermal conductive structure 350 and the plurality of parallel hollow fluid channels 320 as a single complete structure without requiring bonding or joining of two or more pieces. According to various embodiments, the base part 310a and the porous thermal conductive structure 350 may be made of the same thermal conductive material.

According to various embodiments, the inner cavity 314 of the base plate 310a may have a uniform height (or depth) and the porous thermal conductive structure 350 may have a uniform thickness. According to various embodiments, the height (or the depth) of the inner cavity 314 may be equal to the thickness of the porous thermal conductive structure 350. According to various embodiments, the height (or the depth) of the inner cavity 314 may be slightly larger than the thickness of the porous thermal conductive structure 350. Accordingly, the small gap may be filled or closed during the joining process. According to various embodiments, the top part 310b may be integrally bonding to the base part 310a and the porous thermal conductive structure 350 via suitable bonding or joining techniques such as, but not limited to, brazing, diffusion bonding, welding, soldering, etc. According to various embodiments, when the base part 310a, the porous thermal conductive structure 350, and the top part 310b are integrally bonded together, the first subset 322 of the plurality of parallel hollow fluid channels 320 may be separated from the second subset 324 of the plurality of parallel hollow fluid channels 320 while being fluidly connected via the porous thermal conductive structure 350.

According to various embodiments, the thermal conductive side 312 of the plate body 310 may include one or more temperature sensors. According to various embodiments, the one or more temperature sensors may be configured to monitor the temperature conditions of the thermal conductive side 312 of the plate body 310. According to various embodiments, the thermal conductive side 312 of the plate body 310 may include one or more groove configured to hold the one or more temperature sensors. According to various embodiments, the one or more groove may be machined into the thermal conductive side 312 of the plate body 310. According to various embodiments the one or more temperature sensors may include resistance temperature detectors (RTDs).

FIG. 3D shows a flow pattern inside the cold plate 300 (with the top part 310b of the plate body 310 cut away) according to various embodiments. Locations of the at least one fluid inlet 330 and the at least one fluid outlet 340 of the cold plate 300 are represented by dotted lines in FIG. 3D. According to various embodiments, the at least one fluid inlet 330 of the cold plate 300 may include two fluid inlets 330 and the at least one fluid outlet 340 of the cold plate 300 may include two fluid outlets 340. According to various embodiments, the cold plate 300 may include multiple fluid inlets 330 and multiple fluid outlets 340. According to various embodiments, the porous thermal conductive structure 350 in the form of the serpentine-shaped thermal conductive structure may serve as guide channels (which are the plurality of parallel hollow fluid channels 320) for flowing the fluid (e.g. coolant) to spread uniformly within the cold plate 300 for passing or permeating through the porous body of the porous thermal conductive structure 350 so as to achieve a uniform temperature profile along the thermal conductive side 312 of the plate body 310 of the cold plate 300. According to various embodiments, the uniform spreading of fluid inside the cold plate 300 may reduce the temperature gradients along the thermal conductive side 312 of the plate body 310 of the cold plate 300. According to various embodiments, the plurality of parallel hollow fluid channels 320 forms between the serpentine-shaped thermal conductive structure of the porous thermal conductive structure 350 may serve as manifold spreading the fluid within the cold plate 300. According to various embodiments, the cold plate 300 may not require additional manifold part and the overall thickness of the cold plate 300 may be reduced.

According to various embodiments, as shown in FIG. 3D, the plate body 310 of the cold plate 300 may include spaces in the vicinity of the at least one fluid inlet 330 and/or at least one fluid outlet 340 which may serve as respective reservoirs or holding areas for the inlet fluid and outlet fluid. According to various embodiments, the space in the vicinity of the at least one fluid inlet 330 may lead to or diverge into the first subset 322 of the plurality of parallel hollow fluid channels 320. According to various embodiments, the second subset 324 of the plurality of parallel hollow fluid channels 320 may converge into the space in the vicinity of the at least one fluid outlet 340.

According to various embodiments, as shown in FIG. 3D, the plurality of parallel hollow fluid channels 320 may be segregated by the porous thermal conductive structure 350 into the first subset 322 of the plurality of parallel hollow fluid channels 320, the second subset 324 of the plurality of parallel hollow fluid channels 320, a third subset 326 of the plurality of parallel hollow fluid channels 320 and a fourth subset 328 of the plurality of parallel hollow fluid channels 320. According to various embodiments, a first fluid inlet 330a may be in direct fluid communication with the first subset 322 of the plurality of parallel hollow fluid channels 320, and a second fluid inlet 330b may be in direct fluid communication with the third subset 326 of the plurality of parallel hollow fluid channels 320. According to various embodiments, a first fluid outlet 340a may be in direct fluid communication with the second subset 324 of the plurality of parallel hollow fluid channels 320 and a second fluid outlet 340b may be in direct fluid communication with the fourth subset 328 of the plurality of parallel hollow fluid channels 320. According to various embodiments, the porous thermal conductive structure 350 may be arranged inside the plate body 310 to fluidly connects the first subset 322 of the plurality of parallel hollow fluid channels 320 to the second subset 324 of the plurality of parallel hollow fluid channels 320 and the third subset 326 of the plurality of parallel hollow fluid channels 320 to the fourth subset 328 of the plurality of parallel hollow fluid channels 320.

According to various embodiments, the porous thermal conductive structure 350 may be made of sintered copper. According to various embodiments, the porous thermal conductive structure 350 may be a machined sintered copper plate. Accordingly, the porous thermal conductive structure 350 in the form of the machined sintered copper plate may be sandwiched between the base part 310a and the top part 310b of the plate body 310. According to various embodiments, the machined sintered copper plate may have a serpentine shape. According to various embodiments, the porous thermal conductive structure 350 may be machined from a plate of sintered copper. According to various embodiments, the machining process may include any one or a combination of polishing, laser cutting, wire cutting, or electroless nickel plating (ENP). According to various embodiments, electroless nickel plating may be performed for corrosion protection.

According to various embodiments, a method of fabricating the porous thermal conductive structure 350 may include polishing a sintered copper plate. According to various embodiments, the sintered copper plate may be an off-the-shelf sintered copper plate. According to various embodiments, the sintered copper plate may be of any suitable shape, for example a circular plate, a square plate, a rectangular plate etc. According to various embodiments, the method of fabricating the porous thermal conductive structure 350 may further include wire cutting the polished sintered copper plate into the serpentine geometry with the plurality of hollow fluid channels 320. According to various embodiments, a width of each of the plurality of hollow fluid channels 320 may be 1-2 mm According to various embodiments, the method of fabricating the porous thermal conductive structure 350 may further include treating a surface of the serpentine-shaped sintered copper plate via electroless nickel plating so as to prevent oxidation and corrosion.

According to various embodiments, a method of fabricating the cold plate 300 may include the above method of fabricating the porous thermal conductive structure 350. According to various embodiments, the method of fabricating the cold plate 300 may include bonding the fabricated porous thermal conductive structure 350 to the base part 310a of the plate body 310. According to various embodiments, the porous thermal conductive structure 350 may be bonded within or inside the inner cavity 314 of the base part 310a of the plate body 310. According to various embodiments, the base part 310a of the plate body 310 may be made of good thermal conductivity material. According to various embodiments, the method of fabricating the cold plate 300 may include bonding the top part 310b of the plate body 310 to the porous thermal conductive structure 350 and the base part 310a of the plate body 310. According to various embodiments, the method of fabricating the cold plate 300 may include drilling the bonded plate body 310 to create the at least one fluid inlet 330 and the at least one fluid outlet 340. According to various embodiments, in the fabricated cold plate 300, the plurality of hollow fluid channels 320 formed by the porous thermal conductive structure 350 may serve as manifold to uniformly spread the fluid that has entered the cold plate 300 via the at least one fluid inlet 320, and also the fluid inside the cold plate 300 that is flowing towards the at least one fluid outlet 330. According to various embodiments, the flow path of the fluid through the cold plate 300 may through the at least one fluid inlet 330, to an inlet reservoir, to the first subset 322 of the plurality of hollow fluid channels 320, across and through the porous thermal conductive structure 350, to the second subset 324 of the plurality of hollow fluid channels 320, to an outlet reservoir, and through the at least one fluid outlet 340. According to various embodiments, the uniform spreading of fluid (e.g. coolant) inside the cold plate 300 may reduce the temperature gradient along the thermal conductive side 312 of the cold plate 300.

According to various embodiments, the porous thermal conductive structure 350 may be fabricated by direct sintering of metal particles within a mold so as to obtain the porous thermal conductive structure 350 with the desired shape. According to various embodiments, the porous thermal conductive structure 350 may be fabricated by heating freely stacked (or slightly compressed) copper particles inside a mold at high temperature with oxygen free low pressure environment. According to various embodiments, the porosity of the sintered copper may be tuneable by varying the portion of additional mixed polymer particles. According to various embodiments, a smaller pore size and a lower porosity of the porous thermal conductive structure 350 may exhibit a higher cooling performance. However, the smaller pore size and the lower porosity of the porous thermal conductive structure 350 may lead to higher pressure drop across the porous thermal conductive structure 350 for the flowing fluid (e.g. coolant).

According to various embodiments, the porous thermal conductive structure 350 may be fabricated by additive manufacturing. According to various embodiments, the porous thermal conductive structure 350 may be fabricated by three dimensional (3D) printing. According to various embodiments, 3D printing may include 3D laser printing.

According to various embodiments, the porous thermal conductive structure 350 may be fabricated together with the base part 310a so as to form a single integral part by additive manufacturing, such as three dimensional (3D) printing. According to various embodiments, coarse printing resolution and/or large metal particle size may be used if high porosity is required. According to various embodiments, the porous thermal conductive structure 350 with the plurality of hollow fluid channels 320 (and/or with the required geometries and slots) may be directly 3D printed onto the base part 310a to form a single unitary part, without requiring wire cutting and/or brazing. According to various embodiments, fabricating the porous thermal conductive structure 350 with the base part 310a as a single unitary piece may be useful when the top part 310b is a non-metal material (e.g. plastic).

According to various embodiments, the base part 310a of the plate body 310 may be made of copper. According to various embodiments, base part 310a of the plate body 310 may be machined from a copper block.

Figure 4A:
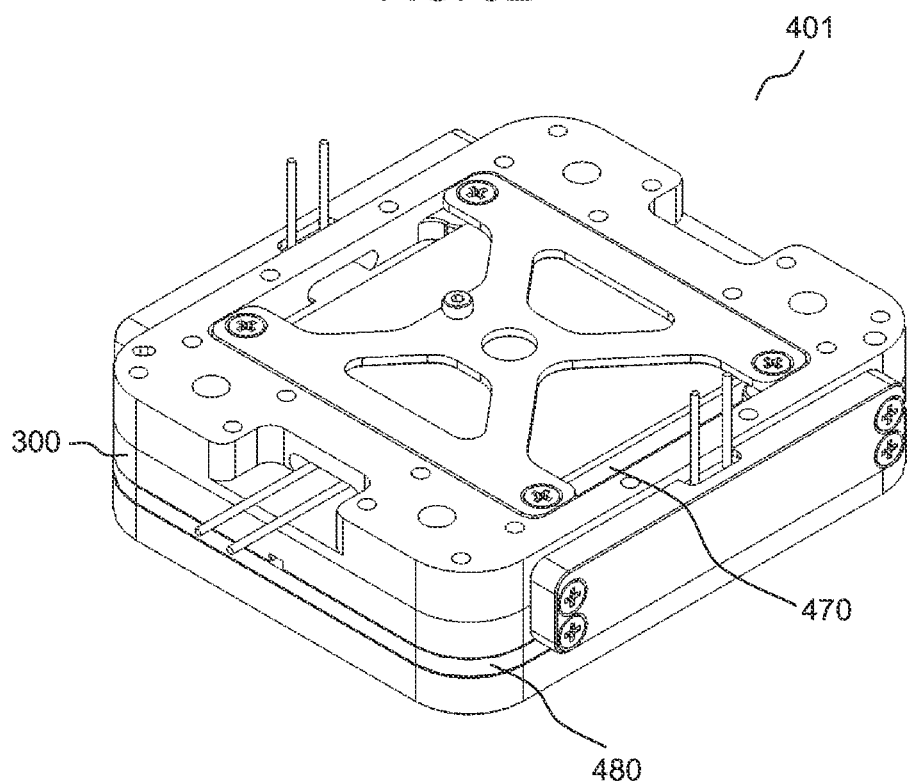
FIG. 4A shows an active thermal control assembly according to various embodiments.
Figure 4B:
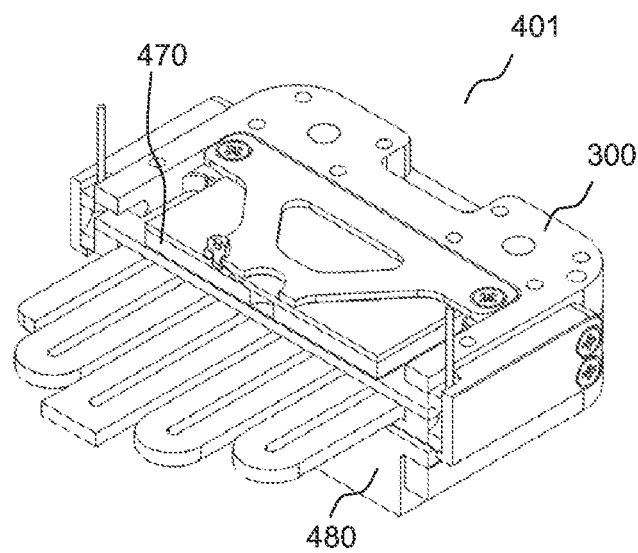
FIG. 4B shows a cut away view of the active thermal control assembly of FIG. 4A according to various embodiments.
Figure 4C:
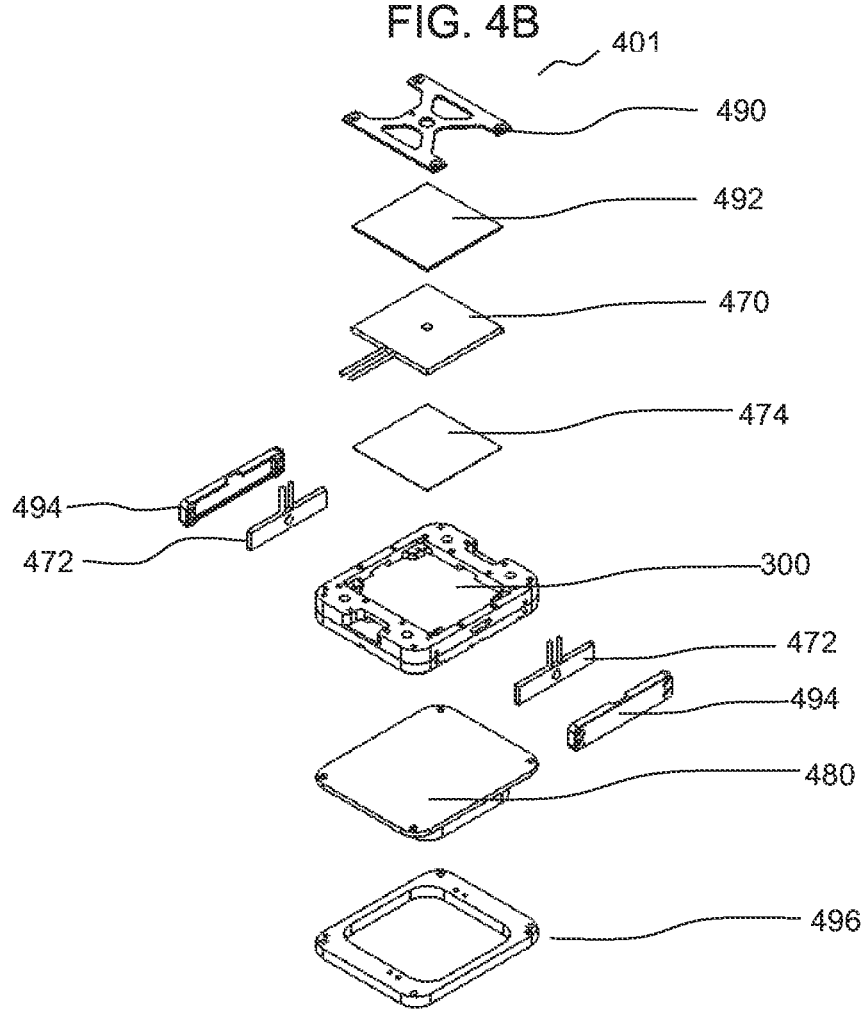
FIG. 4C shows an exploded view of the active thermal control assembly of FIG. 4A according to various embodiments.

According to various embodiments, the top part 310b of the plate body 310 may include a heater receptacle region 316 which is on an exterior surface of the top part 310b and which is configured for receiving a heater member 470 (see FIG. 4A to FIG. 4C). According to various embodiments the heater receptacle region 316 may be a receding portion of the exterior surface of the top part 310b. According to various embodiments, the heater member 470 may be inserted into the heater receptacle region 316. Accordingly, the heater member 470 may be placed in the heater receptacle region 316 of the plate body 310 such that the heater member 470 may be resting on the cold plate 300 within the heater receptacle region 316. According to various embodiments, the top part 310b of the plate body 310 may be made of good thermal conductivity material. According to various embodiments, the heater receptacle region 316 may be a secondary thermal conductive side of the plate body 310.

According to various embodiments, a variant of the cold plate 300 (not shown) may be similar to the cold plate 200 of FIG. 2A and FIG. 2B. According to various embodiments, the variant of the cold plate 300 may include the porous thermal conductive structure 350 as a single block without the plurality of hollow fluid channels 320 being formed in the porous thermal conductive structure 350. In this variant of the cold plate 300, the plurality of hollow fluid channels 320 may be recessed into the top part 310b of the plate body 310 via machining technique. When the surface of the top part 310b with the plurality of hollow fluid channels 320 is placed flat onto a corresponding surface of the porous thermal conductive structure 350, the plurality of hollow fluid channels 320 may be segregated into the first subset 322 of the plurality of hollow fluid channels 320 and the second subset 324 of the plurality of hollow fluid channels 320 based on the manner in which the plurality of hollow fluid channels 320 is being machined into the top part 310b. According to various embodiments, in this variant of the cold plate 300, the top part 310b may serve as a traditional manifold. According to various embodiments, the fluid may enter this variant of the cold plate 300 via the at least one fluid inlet 330, spread through the first subset 322 of the plurality of hollow fluid channels 320 in the top part 310b, pass or permeate through the porous thermal conductive structure 350, enter the second subset 324 of the plurality of hollow fluid channels 320, and finally flow out of this variant of the cold plate 300 via the at least one fluid outlet 340.

FIG. 4A shows an active thermal control assembly 401 according to various embodiments. FIG. 4B shows a cut away view of the active thermal control assembly 401 of FIG. 4A according to various embodiments. FIG. 4C shows an exploded view of the active thermal control assembly 401 of FIG. 4A according to various embodiments. According to various embodiments, the active thermal control assembly 401 may include the cold plate 300 of FIG. 3A to FIG. 3E. According to various embodiments, the active thermal control assembly 401 may further include a heater member 470 coupled to the cold plate 300. According to various embodiments, the active thermal control assembly 401 may include one or more fluid control valves (not shown) coupled to the at least one fluid inlet 330 of the cold plate 300.

According to various embodiments, the heater member 470 may be inserted and fasten in the heater receptacle region 316 of the plate body 310 of the cold plate 300. According to various embodiments, the active thermal control assembly 401 may be configured to dynamically control the temperature of the cold plate 300 based on the combination of the heating effect of the heater member 470 and the cooling effect of flowing fluid through the cold plate 300. According to various embodiments, the active thermal control assembly 401 may include a processor to control the heater member 470 and the flow of fluid through the cold plate 300 so as to dynamically control the temperature of the cold plate 300. According to various embodiments, the processor may control a valve of the fluid flowing into the cold plate 300 and a relay of the heater member 470. According to various embodiments, the processor may be a proportional-integral-derivative (PID) controller. According to various embodiments, the temperature of the cold plate 300 may be controlled and balanced by the processor to achieve an active thermal control effect (e.g. a stable temperature, or a desired thermal ramp up or down rate, and so on, with or without the external thermal loads from the electronic component in contact with the cold plate 300). According to various embodiments, the heater member 470 may be a ceramic heater.

According to various embodiments, the one or more fluid control valves may be located along a flow line which directs or channels the fluid towards the at least one fluid inlet 330 of the cold plate 300 such that the one or more fluid control valves may be controlled to regulate the rate of flow into the at least one inlet 330. According to various embodiments, the one or more fluid control valves may be directly coupled to the at least one fluid inlet 330 of the cold plate 300 such that the one or more fluid control valves may be controlled to directly regulate the rate of flow through the at least one inlet 330.

According to various embodiments, not shown, the heater member may not be coupled to the top part 310b of the plate body 310 of the cold plate 300. Accordingly, the top part 310b of the plate body 310 of the cold plate 300 may not be made of good thermal conductivity material. According to various embodiments, the top part 310b of the plate body 310 of the cold plate 300 may be made of other suitable material such as polyether ether ketone (PEEK), or Semitron® material. According to various embodiments, the top part 310b of the plate body 310 may be attached to the base part 310a of the plate body 310 via bolts, using gasket sealing. According to various embodiments, not shown, the heater member may be attached to the side wall of the cold plate 300, below the cold plate 300, inside the cold plate 300, and so on. According to various embodiments, the heater member may not be a ceramic heater.

As shown in FIG. 4A to FIG. 4C, the active thermal control assembly 401 may include the heater member 470 attached on top of the cold plate 300. According to various embodiments, the heater member 470 may be of a square shape. According to various embodiments, the active thermal control assembly 401 may further include a pedestal 480 attached below or underneath the cold plate 300. Accordingly, the heater member 470 may be attached to one planar side of the cold plate 300 and the pedestal 480 may be attached to another planar side of the cold plate 300. According to various embodiments, the pedestal 480 may be configured to adapt a size of the cold plate 300 to fit the electronic component which the active thermal control is to be applied so as to funnel the thermal energy of the electronic component to the cold plate 300 and vice versa. According to various embodiments, the pedestal 480 may provide a heat transfer route between the electronic component and the cold plate 300. According to various embodiments, additional heaters and/or temperature sensors may be coupled to the pedestal 480 if necessary. According to various embodiments, the additional heaters and/or temperature sensors may be attached inside the pedestal 480.

According to various embodiments, the active thermal control assembly 401 may include one or more side heater member 472 attached on the sides of the cold plate 300. According to various embodiments, as shown, the active thermal control assembly 401 may include two side heaters. According to various embodiments, the heater member 470 and the one or more side heater member 472 may be configured to heat up the cold plate 300. According to various embodiments, in combination of the flowing cold fluid inside the cold plate 300, the heater member 470 and the one or more side heater member 472 may dynamically vary the temperature of the cold plate 300 controlled via a processor, e.g. PID programme According to various embodiments, thermal conductive sheets 474 may be applied between the heater member 470 and the cold plate 300, as well as between the cold plate 300 and the pedestal 480.

According to various embodiments, the active thermal control assembly 401 may include a top heater holder 490 for retaining the heater member 470 within the heater receptacle region 316 of the plate body 310 of the cold plate 300. According to various embodiments, the active thermal control assembly 401 may include an insulator sheet 492 sandwiched between the top heater holder 490 and the heater member 470. According to various embodiments, the active thermal control assembly 401 may include one or more side heater holder 494 for retaining the one or more side heater members 472 to the sides of the plate body 310 of the cold plate 300. According to various embodiments, the active thermal control assembly 401 may include a guide pin holder 496 for aligning and guiding the active thermal control assembly 401 to a location of the electronic component which active thermal control is to be applied.

The following examples pertain to various embodiments.

Example 1 is a cold plate including
a plate body having a thermal conductive side;
a plurality of parallel hollow fluid channels running inside the plate body;
at least one fluid inlet in direct fluid communication with a first subset of the plurality of parallel hollow fluid channels;
at least one fluid outlet in direct fluid communication with a second subset of the plurality of parallel hollow fluid channels; and
a porous thermal conductive structure which is arranged inside the plate body to fluidly connect the first subset of the plurality of parallel hollow fluid channels to the second subset of the plurality of parallel hollow fluid channels, and which is in thermal contact with the thermal conductive side of the plate body,
wherein the porous thermal conductive structure comprises a plurality of elongate fluid contact surface regions, each elongate fluid contact surface region extending continuously lengthwise along a longitudinal side of respective fluid channel for more than half a length of the longitudinal side to serve as a fluid interface between the porous thermal conductive structure and an interior volume of the respective hollow fluid channel.

In Example 2, the subject matter of Example 1 may optionally include that the plurality of parallel hollow fluid channels and the porous thermal conductive structure may be configured to cooperate in a manner in which fluid flows into the first subset of the plurality of parallel hollow fluid channels, enters the porous thermal conductive structure through a first subset of the plurality of elongate fluid contact surface regions along respective longitudinal sides of the first subset of the plurality of parallel hollow fluid channels to permeate across respective portions of the porous thermal conductive structure so as to cause a transfer of thermal energy between the fluid and the porous thermal conductive structure, and exits the porous thermal conductive structure through a second subset of the plurality of elongate fluid contact surface regions along respective longitudinal sides of the second subset of the plurality of parallel hollow fluid channels into the second subset of the plurality of parallel hollow fluid channels.

In Example 3, the subject matter of Example 1 or 2 may optionally include that the plurality of parallel hollow fluid channels may be arranged in a manner so as to alternate between the first subset of the plurality of parallel hollow fluid channels and the second subset of the plurality of parallel hollow fluid channels.

In Example 4, the subject matter of any one of Examples 1 to 3 may optionally include that the porous thermal conductive structure may include one or more elongate portions, each elongate portion having two elongated fluid contact surface regions on two opposite longitudinal sides of the elongate portion.

In Example 5, the subject matter of Example 4 may optionally include that the porous thermal conductive structure may include a serpentine-shaped thermal conductive structure having at least two parallel elongate portions joined by at least a bend portion in a manner so as to form a single continuous structure.

In Example 6, the subject matter of Example 4 or 5 may optionally include that the plate body may include an inner cavity and the porous thermal conductive structure may be disposed in the inner cavity of the plate body in a manner so as to divide the inner cavity into the plurality of parallel hollow fluid channels.

In Example 7, the subject matter of Example 6 may optionally include that the inner cavity may have a uniform height and the porous thermal conductive structure may have a uniform thickness, and wherein the height of the inner cavity may be equal to the thickness of the porous thermal conductive structure.

In Example 8, the subject matter of Example 6 or 7 may optionally include that the inner cavity may have at least one alignment element along a side wall of the inner cavity and the porous thermal conductive structure may have a corresponding alignment element.

In Example 9, the subject matter of any one of Examples 1 to 3 may optionally include that the plate body may include an inner cavity having a floor surface at the thermal conductive side of the plate body and an opposing ceiling surface with the plurality of parallel hollow fluid channels recessed into the ceiling surface, wherein the porous thermal conductive structure may include a block structure with a base surface in engagement with the floor surface of the inner cavity and an opposite top surface in engagement with the ceiling surface of the inner cavity, and wherein the plurality of elongate fluid contact surface regions may be on the top surface of the porous thermal conductive structure.

In Example 10, the subject matter of any one of Examples 1 to 9 may optionally include that the plate body may include a base part and a top part integrally bonded together.

In Example 11, the subject matter of Example 10 may optionally include that the porous thermal conductive structure may be integrally molded or printed with the base part.

In Example 12, the subject matter of any one of Examples 1 to 11 may optionally include that the porous thermal conductive structure may be integrally bonded to the plate body.

In Example 13, the subject matter of any one of Examples 1 to 12 may optionally include that the thermal conductive side of the plate body may include one or more temperature sensors.

Example 14 is a method of manufacturing a cold plate, the method including integrally bonding a base part of a plate body, a porous thermal conductive structure, and a top part of a plate body in a manner to form the cold plate according to any one of Examples 1 to 9.

In Example 15, the subject matter of Example 14 may optionally include integrally molding or printing the porous thermal conductive structure with the base part of the plate body.

Example 16 is an active thermal control assembly, including
the cold plate according to any one of Examples 1 to 13;
a heater member coupled to the cold plate; and
one or more fluid control valves coupled to the at least one inlet of the cold plate.

Various embodiments have provided a simple and effective cold plate that may achieve uniform spreading of fluid inside the cold plate so as to reduce the temperature gradients along the thermal conductive side of the cold plate. Various embodiments have provided a simple and effective active thermal control assembly that may achieve dynamic control of temperature for active thermal control.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. A cold plate comprising:
a plate body having a thermal conductive side;
a plurality of parallel hollow fluid channels running inside the plate body;
at least one fluid inlet in direct fluid communication with a first subset of the plurality of parallel hollow fluid channels;
at least one fluid outlet in direct fluid communication with a second subset of the plurality of parallel hollow fluid channels; and
a porous thermal conductive structure which is arranged inside the plate body to fluidly connect the first subset of the plurality of parallel hollow fluid channels to the second subset of the plurality of parallel hollow fluid channels, and which is in thermal contact with the thermal conductive side of the plate body,
wherein the porous thermal conductive structure comprises a plurality of elongate fluid contact surface regions, each elongate fluid contact surface region extending continuously lengthwise along a longitudinal side of a respective fluid channel for more than half a length of the longitudinal side to serve as a fluid interface between the porous thermal conductive structure and an interior volume of the respective hollow fluid channel;
wherein the plate body comprises an inner cavity having a floor surface at the thermal conductive side of the plate body and an opposing ceiling surface with the plurality of parallel hollow fluid channels recessed into the ceiling surface, wherein the porous thermal conductive structure comprises a block structure with a base surface in engagement with the floor surface of the inner cavity and an opposite top surface in engagement with the ceiling surface of the inner cavity, and wherein the plurality of elongate fluid contact surface regions are on the top surface of the porous thermal conductive structure;
wherein the plate body comprises a base part and a top part;
wherein the base part comprises a recessed portion and the floor surface;
wherein the top part comprises the ceiling surface with the plurality of parallel hollow fluid channels recessed into the ceiling surface; and
wherein the recessed portion of the base part together with the ceiling surface of the top part form the inner cavity.

2. The cold plate as claimed in claim 1, wherein the plurality of parallel hollow fluid channels and the porous thermal conductive structure are configured to cooperate in a manner in which fluid flows into the first subset of the plurality of parallel hollow fluid channels, enters the porous thermal conductive structure through a first subset of the plurality of elongate fluid contact surface regions along respective longitudinal sides of the first subset of the plurality of parallel hollow fluid channels to permeate across respective portions of the porous thermal conductive structure so as to cause a transfer of thermal energy between the fluid and the porous thermal conductive structure, and exits the porous thermal conductive structure through a second subset of the plurality of elongate fluid contact surface regions along respective longitudinal sides of the second subset of the plurality of parallel hollow fluid channels into the second subset of the plurality of parallel hollow fluid channels.

3. The cold plate as claimed in claim 1, wherein the plurality of parallel hollow fluid channels are arranged in a manner so as to alternate between the first subset of the plurality of parallel hollow fluid channels and the second subset of the plurality of parallel hollow fluid channels.

4. The cold plate as claimed in claim 1, wherein the plurality of parallel hollow fluid channels are uniformly spaced apart from each other.

5. The cold plate as claimed in claim 1, wherein the base part and the top part are integrally bonded together.

6. The cold plate as claimed in claim 5, wherein the porous thermal conductive structure is integrally molded or printed with the base part.

7. The cold plate as claimed in claim 1, wherein the porous thermal conductive structure is integrally bonded to the plate body.

8. The cold plate as claimed in claim 1, wherein the block structure fills up the recessed portion of the base part.

9. The cold plate as claimed in claim 1,
wherein the plurality of parallel hollow fluid channels comprise a plurality of openings along the ceiling surface of the plate body that opens to the inner cavity;
wherein each elongate fluid contact surface region of the block structure of the porous thermal conductive structure entirely covers a respective opening of the plurality of openings of the plurality of the parallel hollow fluid channels.

10. The cold plate as claimed in claim 1,
wherein the plurality of parallel hollow fluid channels are recessed into the ceiling surface of the top part so as to form a plurality of channel walls in the top part which laterally separates the first subset of the plurality of parallel hollow fluid channels from the second subset of the plurality of parallel hollow fluid channels.

11. The cold plate as claimed in claim 1,
wherein the base part comprises a first thermal conductive material and the top part comprises a second thermal conductive material that is different from the first thermal conductive material.

12. The cold plate as claimed in claim 1, wherein the thermal conductive side of the plate body comprises one or more temperature sensors.

13. An active thermal control assembly, comprising:
a cold plate comprising
a plate body having a thermal conductive side,
a plurality of parallel hollow fluid channels running inside the plate body,
at least one fluid inlet in direct fluid communication with a first subset of the plurality of parallel hollow fluid channels,
at least one fluid outlet in direct fluid communication with a second subset of the plurality of parallel hollow fluid channels, and
a porous thermal conductive structure which is arranged inside the plate body to fluidly connect the first subset of the plurality of parallel hollow fluid channels to the second subset of the plurality of parallel hollow fluid channels, and which is in thermal contact with the thermal conductive side of the plate body,
wherein the porous thermal conductive structure comprises a plurality of elongate fluid contact surface regions, each elongate fluid contact surface region extending continuously lengthwise along a longitudinal side of a respective fluid channel for more than half a length of the longitudinal side to serve as a fluid interface between the porous thermal conductive structure and an interior volume of the respective hollow fluid channel;
wherein the plate body comprises an inner cavity having a floor surface at the thermal conductive side of the plate body and an opposing ceiling surface with the plurality of parallel hollow fluid channels recessed into the ceiling surface, wherein the porous thermal conductive structure comprises a block structure with a base surface in engagement with the floor surface of the inner cavity and an opposite top surface in engagement with the ceiling surface of the inner cavity, and wherein the plurality of elongate fluid contact surface regions are on the top surface of the porous thermal conductive structure;
wherein the plate body comprises a base part and a top part;
wherein the base part comprises a recessed portion and the floor surface;
wherein the top part comprises the ceiling surface with the plurality of parallel hollow fluid channels recessed into the ceiling surface;
wherein the recessed portion of the base part together with the ceiling surface of the top part form the inner cavity;
a heater member coupled to the cold plate; and
one or more fluid control valves coupled to the at least one fluid inlet of the cold plate.

14. The active thermal control assembly as claimed in claim 13, wherein the plurality of parallel hollow fluid channels of the cold plate and the porous thermal conductive structure of the cold plate are configured to cooperate in a manner in which fluid flows into the first subset of the plurality of parallel hollow fluid channels, enters the porous thermal conductive structure through a first subset of the plurality of elongate fluid contact surface regions along respective longitudinal sides of the first subset of the plurality of parallel hollow fluid channels to permeate across respective portions of the porous thermal conductive structure so as to cause a transfer of thermal energy between the fluid and the porous thermal conductive structure, and exits the porous thermal conductive structure through a second subset of the plurality of elongate fluid contact surface regions along respective longitudinal sides of the second subset of the plurality of parallel hollow fluid channels into the second subset of the plurality of parallel hollow fluid channels.

15. The active thermal control assembly as claimed in claim 13, wherein the plurality of parallel hollow fluid channels of the cold plate are arranged in a manner so as to alternate between the first subset of the plurality of parallel hollow fluid channels and the second subset of the plurality of parallel hollow fluid channels.

16. The active thermal control assembly as claimed in claim 13, wherein the base part and the top part are integrally bonded together.

17. The active thermal control assembly as claimed in claim 16, wherein the porous thermal conductive structure is integrally molded or printed with the base part.

18. The active thermal control assembly as claimed in claim 13, wherein the porous thermal conductive structure is integrally bonded to the plate body.

19. The active thermal control assembly as claimed in claim 13, wherein the thermal conductive side of the plate body comprises one or more temperature sensors.

\* \* \* \* \*